(12) United States Patent
Kang

(10) Patent No.: US 6,721,198 B2
(45) Date of Patent: Apr. 13, 2004

(54) NONVOLATILE FERROELECTRIC MEMORY DEVICE AND DRIVING METHOD THEREOF

(75) Inventor: Hee Bok Kang, Daejon-shi (KR)

(73) Assignee: Hynix Corporation, Kyoungki-Do (KR)

( * ) Notice: Subject to any disclaimer, the term of this patent is extended or adjusted under 35 U.S.C. 154(b) by 0 days.

(21) Appl. No.: 10/287,823

(22) Filed: Nov. 5, 2002

(65) Prior Publication Data

US 2003/0099125 A1 May 29, 2003

(30) Foreign Application Priority Data

Nov. 17, 2001 (KR) .................................. P2001-71572

(51) Int. Cl.[7] ............................................... G11C 11/22
(52) U.S. Cl. .................... 365/145; 365/63; 365/210; 365/230.03
(58) Field of Search ............................ 365/145, 210, 365/63, 230.03

(56) References Cited

U.S. PATENT DOCUMENTS

| | | | | |
|---|---|---|---|---|
| 5,418,750 A | * | 5/1995 | Shiratake et al. | 365/206 |
| 6,128,213 A | * | 10/2000 | Kang | 365/145 |
| 6,236,588 B1 | * | 5/2001 | Koo | 365/145 |
| 6,570,781 B1 | * | 5/2003 | Lee et al. | 365/63 |

* cited by examiner

Primary Examiner—Son T. Dinh
(74) Attorney, Agent, or Firm—Morgan, Lewis & Bockius LLP

(57) ABSTRACT

A nonvolatile ferroelectric memory device includes a plurality of sense amplifiers, top and bottom cell array units disposed respectively at an upper and a lower sections, the top and bottom cell array units each including a plurality of unit cells, and being disposed symmetrically about the sense amplifiers. The nonvolatile ferroelectric memory device further includes at least one top reference array unit, at least one bottom reference array unit, a plurality of main bit lines connected to the unit cells of the top or bottom cell array unit, and a plurality of reference bit lines of the bottom or top cell array unit. Reference bit lines of the top or bottom cell array unit correspond to main bit lines of the bottom or top cell array unit disposed symmetrically about the sense amplifiers.

29 Claims, 29 Drawing Sheets

NONVOLATILE FERROELECTRIC MEMORY DEVICE AND DRIVING METHOD THEREOF

This application claims the benefit of Korean Application No. P2001-71572 filed in Korea on Nov. 17, 2001, which is hereby incorporated by reference.

BACKGROUND OF THE INVENTION

1. Field of the Invention

The present invention relates to a semiconductor memory device, and more particularly, to a nonvolatile memory device and a driving method thereof.

2. Discussion of the Related Art

Generally, a nonvolatile ferroelectric memory device, for example FRAM (Ferroelectric Random Access Memory), has a data processing speed similar to that of DRAM (Dynamic Random Access Memory), and also enables retention of stored data when power is off, thereby attracting public interest as a next generation memory device.

FRAM is a memory device having a structure similar to DRAM. However, unlike a DRAM memory cell, an FRAM memory cell uses ferroelectrics as a capacitor material to benefit from a high remanent polarization characteristic of ferroelectric materials. Due to the remanent polarization of the ferroelectric capacitor, data stored in an FRAM memory cell is not erased even if the electric field applied across the memory cell is removed.

FIG. 1 illustrates a graph of a hysteresis loop typical of ferroelectrics. Referring to FIG. 1, polarization induced by an electric field is not eliminated even if the electric field is removed, but maintains a predetermined quantity (d or a state) due to remanent polarization (or spontaneous polarization). A nonvolatile ferroelectric memory cell is a memory device using the d and a states of the ferroelectric capacitive material therein as digital logic value "1" and digital logic value "0", respectively.

A nonvolatile ferroelectric memory device according to a related art is explained in the following by referring to the attached drawings. FIG. 2 illustrates a diagram of a unit cell of a general ferroelectric memory. Referring to FIG. 2, a bit line B/L is disposed in one direction of the memory device; a word line W/L is disposed in a transversal direction with respect to the bit line B/L; a plate line P/L is disposed in the same direction as the word line W/L and at a predetermined distance therefrom; a transistor T1 is disposed in such a manner that a gate and a source thereof are respectively connected to the word and bit lines, and a ferroelectric capacitor FC1 is disposed in such a manner that the first and second terminals thereof are respectively connected to the drain of transistor T1 and the plate line P/L of the memory device.

Data input/output operation of such a nonvolatile ferroelectric memory device is explained as follows. FIG. 3A illustrates a timing diagram for a plurality of signals at the input and output lines of a ferroelectric memory device during a write operation. The write operation is initiated by activating a chip enable signal CSBpad at an input of the memory cell using a high to low transition of an externally applied electrical signal, and simultaneously activating a write enable signal WEBpad with a high to low transition. Subsequently, during an address decoding stage of the write operation, a pulse applied to the word line of a cell is driven low to high to select that cell. To complete the write operation, a high or low signal is applied to the plate line corresponding to the selected memory cell for a predetermined time interval while the word line is asserted. Furthermore, a high or low signal synchronized with the write enable signal WEBpad is applied to the corresponding bit line depending on whether the input data to be written to the selected FRAM cell is digital logic value "1" or digital logic value "0". Specifically, if the plate line is driven by a low signal while the word line is asserted and the bit line is high, then digital logic value "1" is recorded in the ferroelectric capacitor of the memory cell. If the plate line is driven by a high signal and the bit line is low, then digital logic value "0" is recorded in the ferroelectric capacitor.

FIG. 3B illustrates a timing diagram for a plurality of signals at the input and output lines of a ferroelectric memory device during a read operation. The read operation for extracting stored data from the ferroelectric cell is explained as follows. When the chip enable signal CSBpad is asserted with a high to low voltage externally applied, all the bit lines are held at a low voltage by a driving signal before the corresponding word line is selected. After the bit lines have been deactivated, address decoding is performed. Then, the signal applied to the corresponding word line is raised from a low to a high level by an address decoder to select the targeted cell. A high level signal is applied to the plate line of the selected cell. Consequently, if digital logic value "1" was stored in the FRAM cell, the ferroelectric capacitor will be switched from the corresponding polarization state Qs to the opposite polarization state, thereby destroying the data stored in the memory cell. In contrast, if the data stored in the ferroelectric memory cell is digital logic value "0", then the polarization state Qns of the capacitor is not switched by the signal applied to the plate line.

The variation of electric charge between the electrical dipoles in the ferroelectric material will differ depending on whether the polarization state of the cell is switched or not. Hence, the variation of the polarization state from a digital logic value "1" to digital logic value "0" can be detected using a sense amplifier. Specifically, when data stored in the memory cell is destroyed by a read operation, the polarization state changes from d to f according to the hysteresis loop in FIG. 1. In contrast, when stored data is not destroyed by the read operation, the polarization state is changed from a to f. A sense amplifier is ordinarily used to differentiate between the two state transitions. When enabled for a specific time duration, the sense amplifier outputs digital logic value "1" if the data stored in the memory cell is erased. However, when the data is not erased, the resulting amplification keeps the output at digital logic value "0". Hence, the original data can be restored using the output of the sense amplifier. Accordingly, the plate line is deactivated "high" to "low" while the high signal is applied to the corresponding word line.

In a schematic diagram of a nonvolatile ferroelectric memory device in FIG. 4 according to the related art, a cell array unit has a folded bit line structure and one sense amplifier is shared by every two main bit lines in the cell array unit, and a middle reference array unit is formed between the cell array unit and an adjacent cell unit array (not shown in the drawing).

A detailed structure of the above-explained nonvolatile ferroelectric memory device is depicted in FIG. 5. The memory device comprises a top section consisting of a first and second cell array units, and a bottom section consisting of a third and fourth array units. The top and bottom sections of the memory device are symmetrically disposed above and below a row of sense amplifiers, respectively. Moreover, an upper reference array unit is disposed between the first and second array units, and a lower reference array unit is disposed between the third and fourth array units.

Each of the cell array units has a folded bit line structure. The two bit lines in the top section shares a corresponding sense amplifier through a first control signal A, and the other two bit lines in the bottom section share the sense amplifier through a second control signal B.

Specifically, if a first bit line in the top section is used as a main bit line, a second adjacent bit line in the top section is used as a reference bit line. Moreover, if a first bit line in the bottom section is used as a main bit line, a second adjacent bit line in the bottom section is used as a reference bit line. Switching transistors are formed between the bit lines and the corresponding sense amplifiers to be controlled by the first and second control signals, respectively. Each of the sense amplifiers, as shown in FIG. 6, has the structure of a latch type amplifier in which bit line signal BL and conjugate bit line signal/BL are connected to both output nodes of the sense amplifier.

Unfortunately, the nonvolatile ferroelectric memory device according to the related art has the following problem or disadvantage. Since adjacent bit lines are used as the main and reference bit lines in the folded bit line structure, the reference data fluctuates randomly due to a capacitive coupling noise component of the main data. Hence, a sensing margin is reduced by the effects of this coupling noise.

SUMMARY OF THE INVENTION

Accordingly, the present invention is directed to a nonvolatile ferroelectric memory device and a driving method thereof that substantially obviate one or more problems due to limitations and disadvantages of the related art.

An object of the present invention is to provide a nonvolatile ferroelectric memory device and a driving method thereof suitable for increasing a sensing margin by overcoming the problem caused by the coupling noise of the bit lines.

Additional features and advantages of the invention will be set forth in the description which follows, and in part will become apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the nonvolatile ferroelectric memory device includes a plurality of sense amplifiers, a top cell array unit disposed at an upper section, and a bottom cell array unit disposed at a lower section, the top and bottom cell array units each including a plurality of unit cells, and the top and bottom cell array units being disposed symmetrically about the sense amplifiers, at least one top reference array unit in a vicinity of the top cell array unit, and at least one bottom reference array unit in a vicinity of the bottom cell array unit, a plurality of main bit lines connected to the unit cells of the top or bottom cell array unit, and a plurality of reference bit lines of the bottom or top cell array unit, wherein reference bit lines of the bottom cell array unit correspond to main bit lines of the top cell array unit disposed symmetrically about the sense amplifiers, and reference bit lines of the top cell array unit correspond to main bit lines of the bottom cell array unit disposed symmetrically about the sense amplifiers.

In another aspect of the present invention, the nonvolatile ferroelectric memory device includes a top cell array unit including a plurality of unit cells, a bottom cell array unit including a plurality of unit cells, a middle reference array unit disposed in a middle area between the top and bottom cell array units, a plurality of edge reference array units disposed at edge sections of the top and bottom cell array units, respectively, and a plurality of sense amplifiers, wherein the top cell array unit is disposed at an upper section, the bottom cell array unit is disposed at a lower section, the top and bottom cell array units being disposed symmetrically about the sense amplifiers, wherein the sense amplifiers are disposed alternately to lie each between the top and bottom cell array units, or between the top cell array unit and an edge reference array unit, or between the bottom cell array unit and an edge reference array unit, wherein bit lines at the lower section below the sense amplifiers disposed between the top and bottom cell array units and the edge reference array units are main bit lines when the bit lines at the upper section above the sense amplifiers disposed between the top and bottom cell array units and the edge reference array units are reference bit lines, and wherein the bit lines at the lower section below the sense amplifiers formed between the top and bottom cell array units and the edge reference array units are the reference bit lines when the bit lines at the upper section above the sense amplifiers formed between the top and bottom cell array units and the edge reference array units are the main bit lines.

In another aspect of the present invention, the nonvolatile ferroelectric memory device includes top and bottom cell array units disposed at an upper and a lower sections symmetrical about a plurality of sense amplifiers, each cell array unit including a plurality of unit cells, a plurality of reference array units disposed at edge sections of the top and bottom cell array units corresponding to the sense amplifiers, respectively, a plurality of bit lines wherein two of the bit lines of the top cell array unit and two of the corresponding bit lines of the bottom cell array unit share one of the sense amplifiers, wherein the bit lines at the lower area symmetrical about the sense amplifiers are used as reference bit lines when the bit lines at the upper area symmetrical about the sense amplifiers are used as main bit lines, and wherein two bit lines adjacent to the main and reference bit lines at the upper and lower sections are used as dummy reference bit lines, and a plurality of switching devices receiving first and second control signals to control whether to connect the sense amplifiers and bit lines to each other wherein corresponding bit lines from the upper and lower sections are symmetrical about the sense amplifiers and are controlled by the same control signal.

In another aspect of the present invention, in a nonvolatile ferroelectric memory device that includes top and bottom cell array units disposed at upper and lower sections symmetrical about sense amplifiers to include a plurality of unit cells, respectively, at least one reference array unit disposed in a vicinity of each of the top and bottom cell array units to correspond to each other, and bit lines disposed on the upper and lower sections to share the sense amplifiers, respectively, a method of driving the nonvolatile ferroelectric memory device having the feature that a reference voltage generated from the reference array unit is applied to the bit lines disposed at the lower sections below the sense amplifiers so that the bit lines at the lower sections operate as reference bit lines when the bit lines disposed at the upper sections above the sense amplifiers operate as main bit lines.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

A nonvolatile ferroelectric memory device and a driving method thereof according to the present invention are explained as follows.

Figure 1:
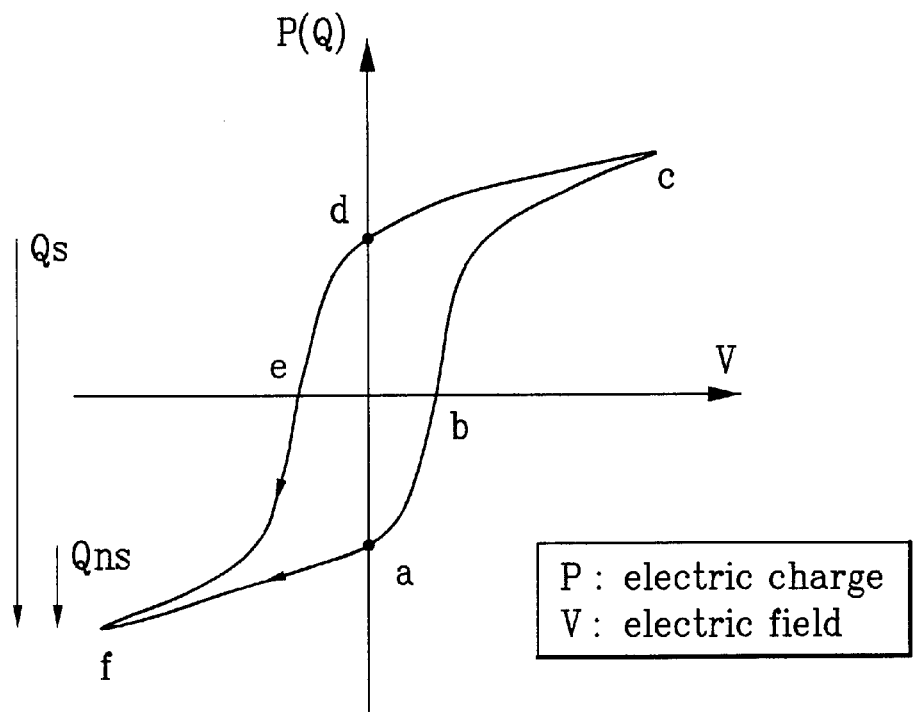
FIG. 1 illustrates a graph of a hysteresis loop characteristic of all ferroelectrics.
Figure 2:
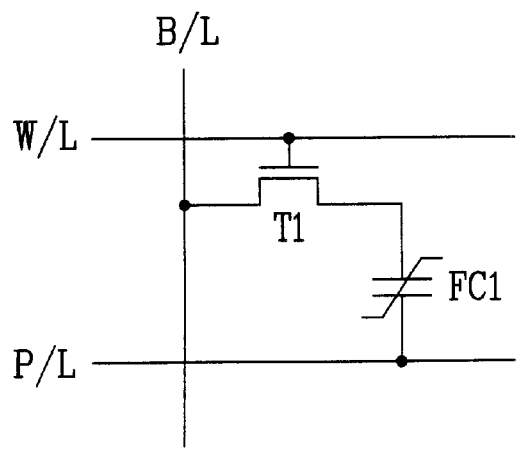
FIG. 2 illustrates a diagram of a unit cell of a general ferroelectric memory cell.
Figure 3A:
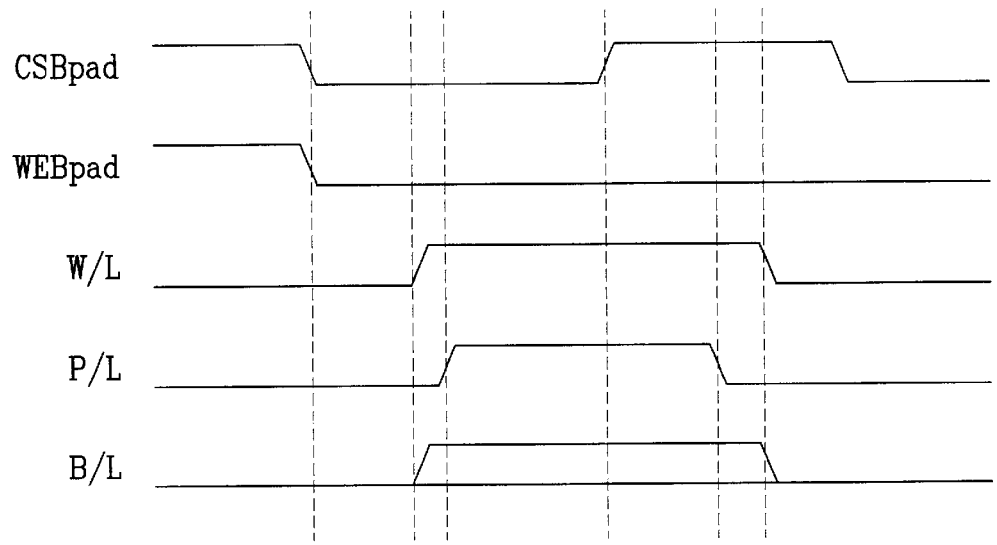
FIG. 3A illustrates an operation timing diagram of a ferroelectric memory during a write operation.
Figure 3B:
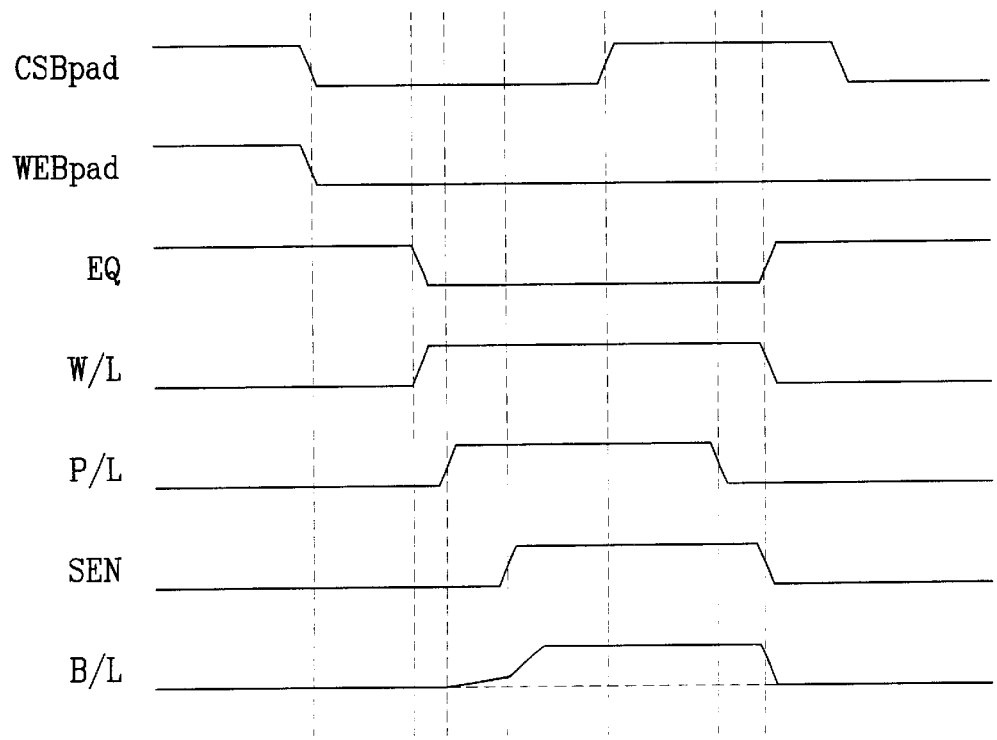
FIG. 3B illustrates an operation timing diagram of a ferroelectric memory during a read operation.
Figure 4:
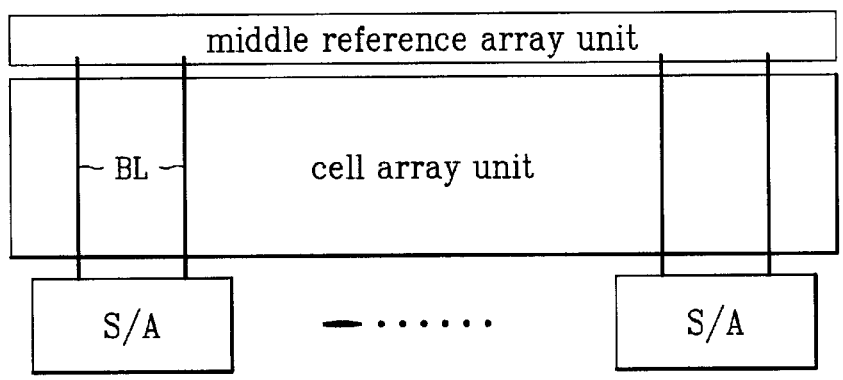
FIG. 4 illustrates schematically a block diagram of a cell array unit having a folded bit line structure according to a related art.
Figure 5:
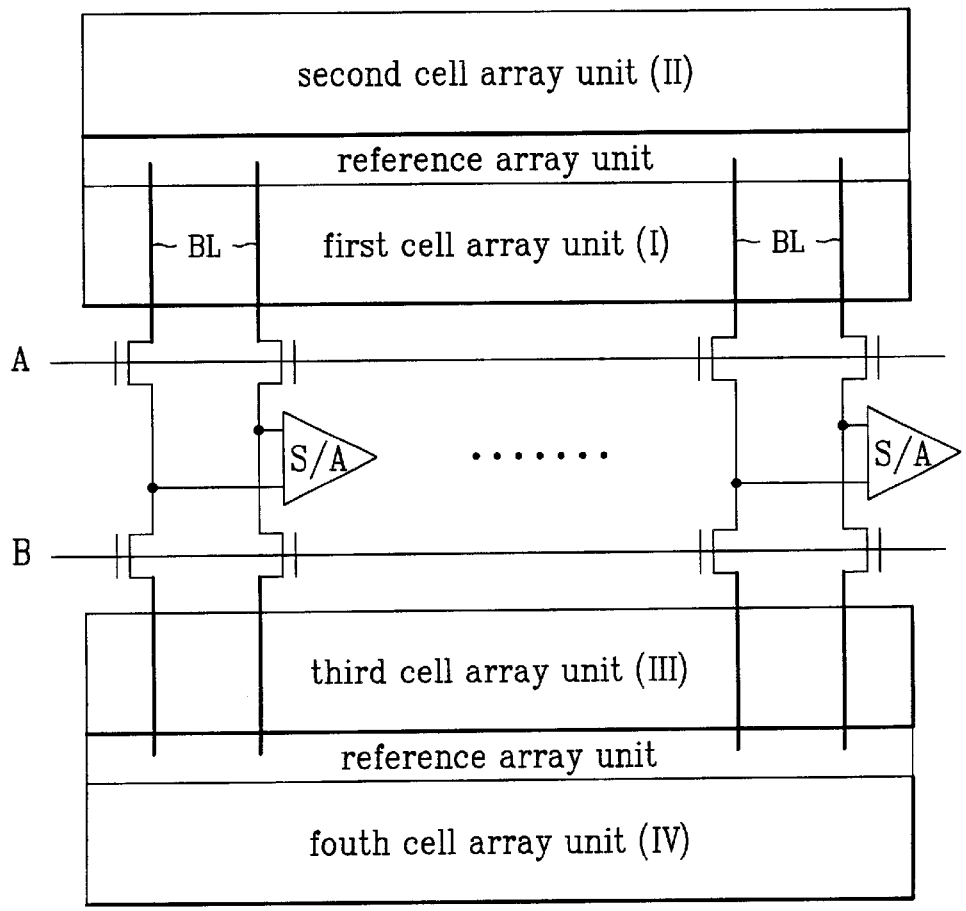
FIG. 5 illustrates a structural block diagram of a nonvolatile ferroelectric memory having a folded bit line structure according to a related art.
Figure 6:
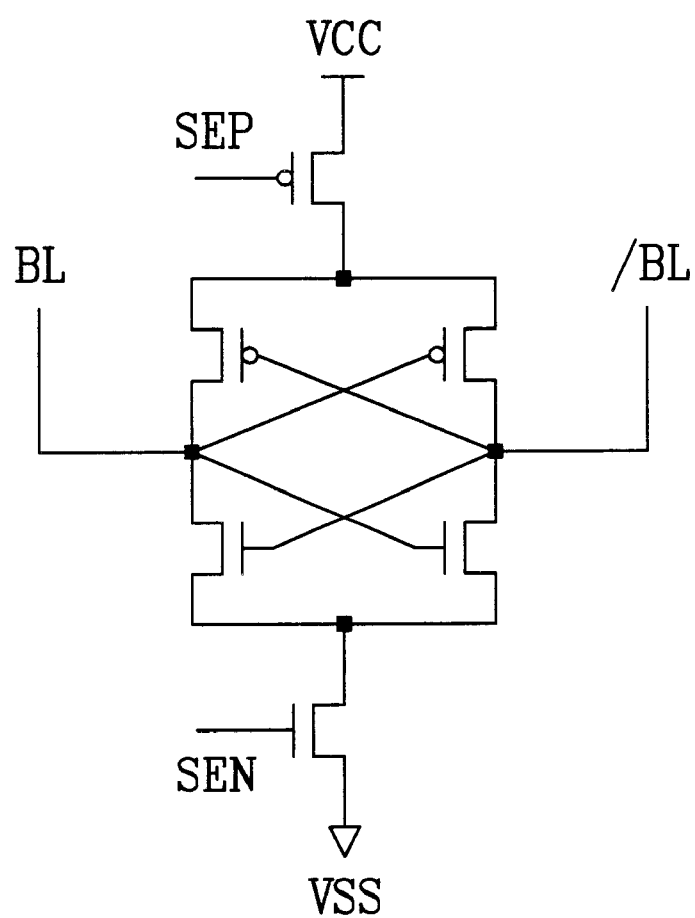
FIG. 6 illustrates a circuit of a sense amplifier unit referred to in FIG. 4 and FIG. 5.
Figure 7:
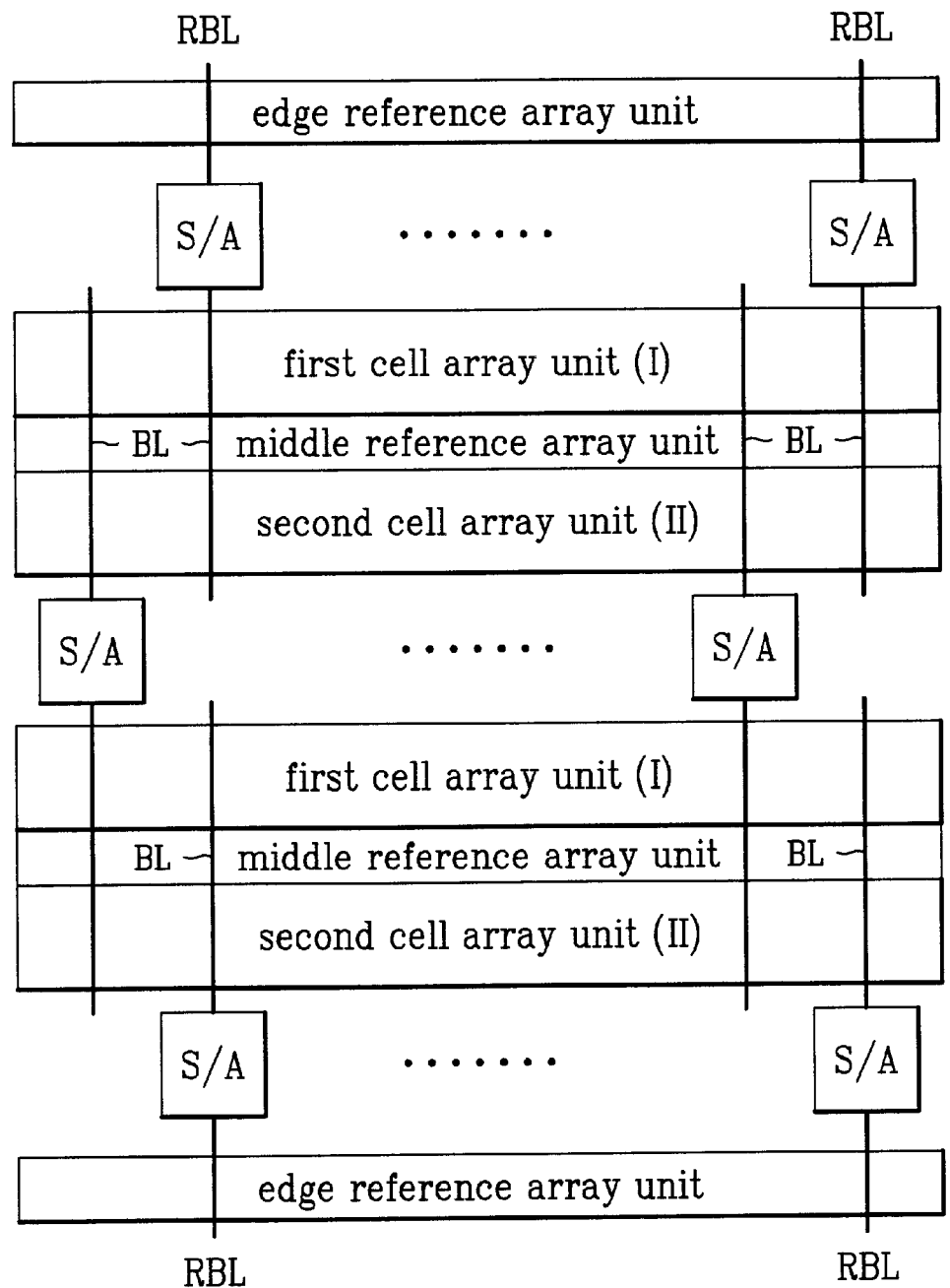
FIG. 7 illustrates a schematic block diagram of a nonvolatile ferroelectric memory according to a first embodiment of the present invention.

In an open bit line cell array, as shown in FIG. 7, middle reference array units exist between every two adjacent cell array units, respectively and additional edge reference array units exist on edge sections, respectively. Bit lines BL are disposed on top/bottom sections symmetrical about sense amplifiers S/A, respectively. If a bit line in the top section is used as a main bit line, a corresponding bit line in the bottom section is used as a reference bit line.

In the following, a basic cell array unit is defined as a cell array unit having a middle reference array unit. Accordingly, the sense amplifiers are disposed alternately to lie either between adjacent basic cell array units, or between a basic cell array unit and an edge reference array units. In other words, when a sense amplifier is disposed between adjacent basic cell array units, the upper bit lines connected to the sense amplifier are used as main bit lines, and the lower bit lines are used as reference bit lines. In contrast, when a sense amplifier is disposed between a basic cell array unit and an edge reference array unit, the upper bit lines connected to the sense amplifier are used as reference bit lines, and the lower bit lines are used as main bit lines.

Figure 8:
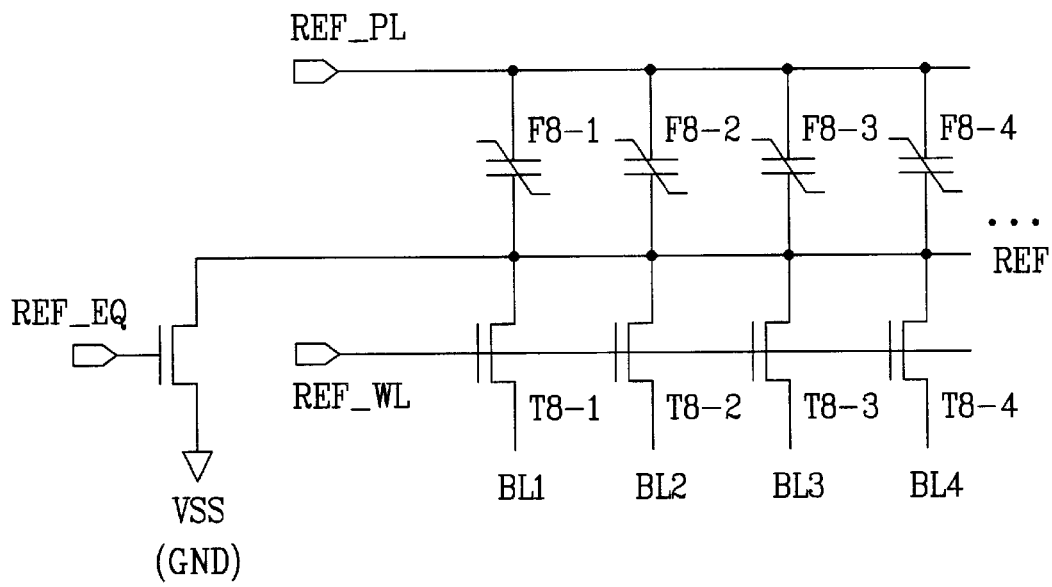
FIG. 8 illustrates a circuit of a middle reference array unit referred to in FIG. 7.

Preferred structures for the middle reference array unit and the edge reference unit referred to in FIG. 7 are explained as follows. The middle reference array unit depicted in FIG. 8 includes a plurality of bit lines BL1, BL2, BL3, BL4, . . . , BLn disposed in one direction in a unit cell block, a reference word line REF_W/L disposed in a direction perpendicular to the bit lines, a reference plate line REF_P/L disposed in the same direction of the reference word line REF_W/L, a plurality of reference capacitors F8-1, F8-2, F8-3, F8-4, . . . , F8-n disposed in parallel with each other to have first and second electrodes connected to the reference plate line REF/PL and storage nodes SN of reference cells, respectively, a level initialization unit including an NMOS transistor having a gate and two electrodes, wherein a reference cell equalizer control signal REF_EQ is applied to the gate and the drain, and source electrodes are connected to a ground terminal GND and a reference line REF, respectively, and a switching block including a plurality of NMOS transistors T8-1, T8-2, T8-3, T8-4, . . . , T8-n having their gates jointly connected to the reference word line REF/WL, and their source and drain electrodes respectively connected to the corresponding bit lines and the storage node SN of the reference capacitors. The reference line REF that acts as the storage node of the capacitors is controlled by the NMOS transistor of the level initialization unit externally.

Figure 10:
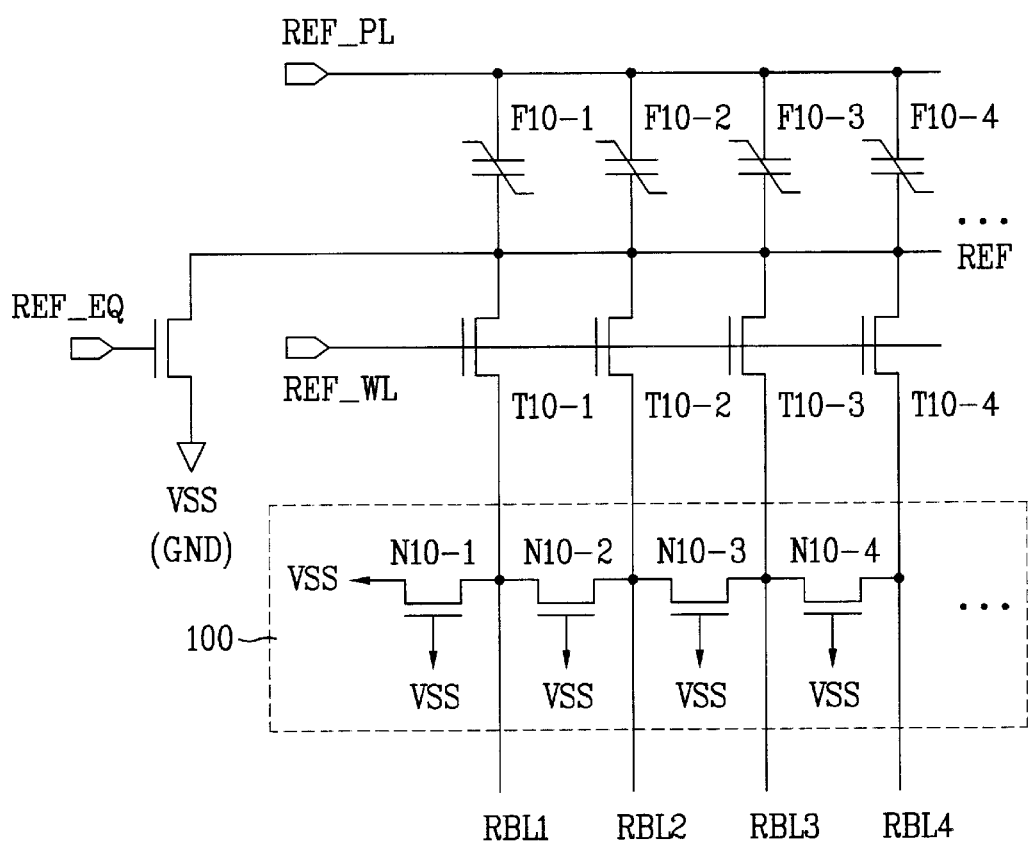
FIG. 10 illustrates a circuit of an edge reference array unit referred to in FIG. 7.

Furthermore, the edge reference array unit, as shown in FIG. 10, includes a dummy load area 100 in addition to the structure of the middle reference array unit, in which the bit lines are replaced by a plurality of reference bit lines RBL1~RBLn, respectively. In this case, NMOS transistors (NMOS capacitors) are connected to the reference bit lines, respectively, so that each of the reference bit lines intersects the source of one NMOS and the drain of the adjacent NMOS transistors, and a gate of each of the NMOS transistors is grounded. Besides, a source terminal of the leftmost NMOS transistor (NMOS capacitor) connected to RBL1 is grounded.

Figure 9:
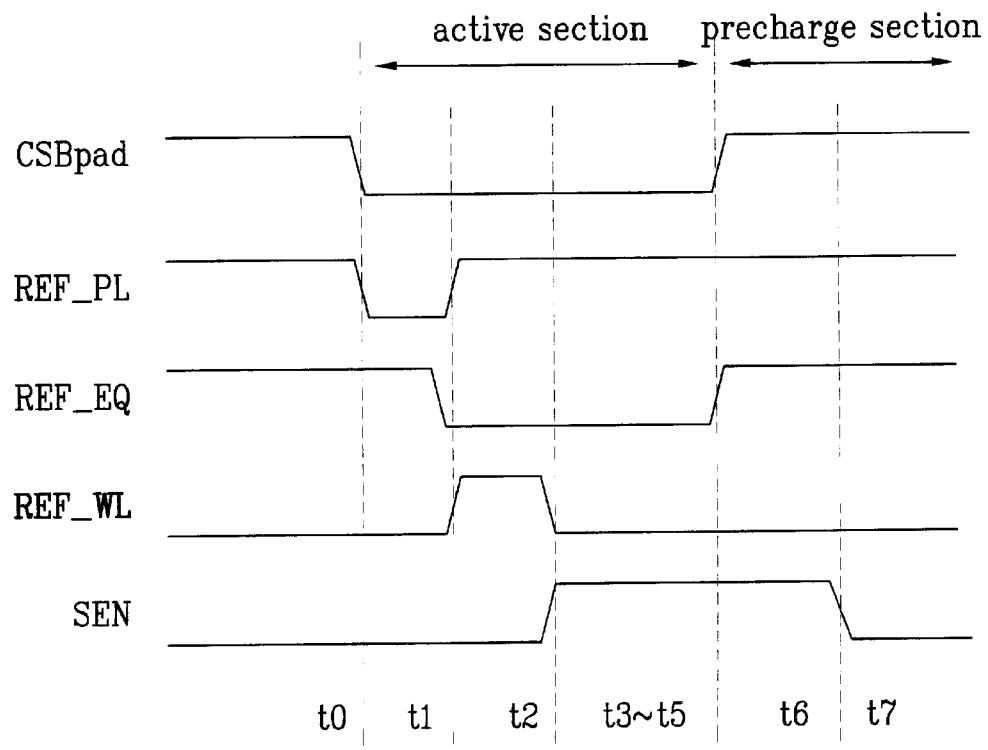
FIG. 9 illustrates an operation timing diagram associated with FIG. 8.

Operation of the above-constituted reference array unit is shown in FIG. 9. Referring to FIG. 9, a "low" level signal appears at the reference plate line REF_PL only for a time duration t1 at the beginning of an active section, and a "high" level signal appears at the reference word line REF_WL for a time duration t2 only. A chip enable signal CSBpad is pulled "low" during the active section and "high" during a precharge section. A reference cell equalizer control signal REF_EQ is pulled "low" level during intervals t2~t5 of the active section. A sense amplifier enable signal is asserted "high" during intervals t3~t6.

Figure 11A:
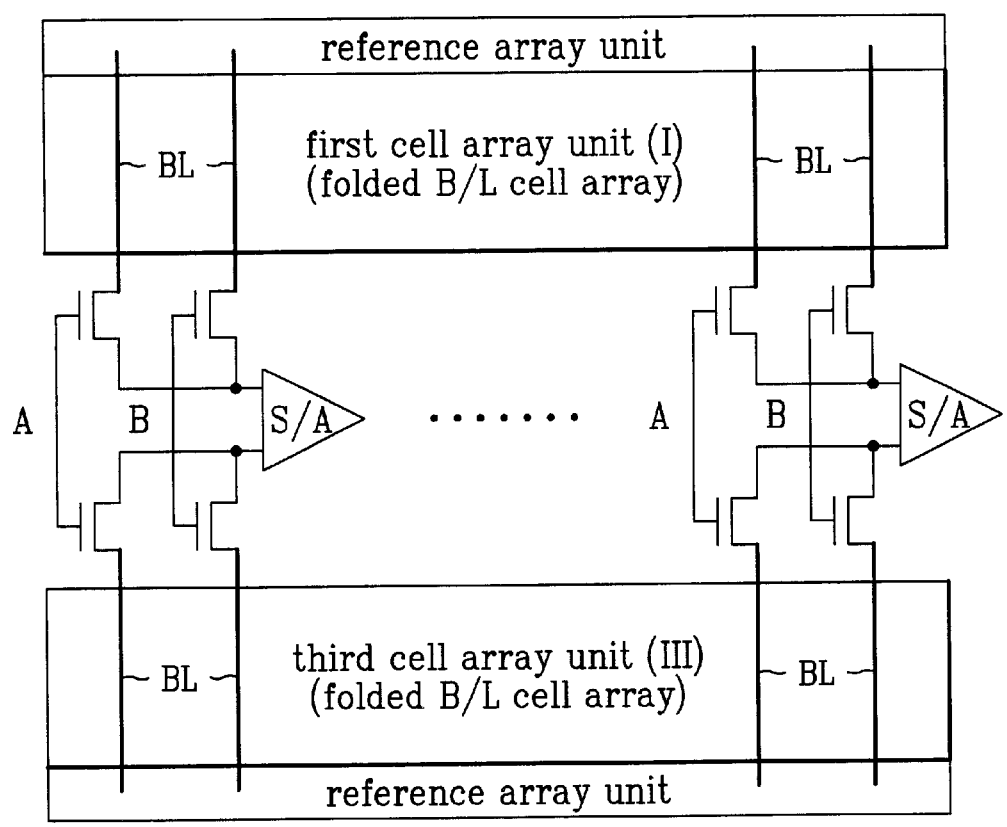
FIG. 11A and FIG. 11B illustrate schematic block diagrams of nonvolatile ferroelectric memory devices according to a second embodiment of the present invention.
Figure 11B:
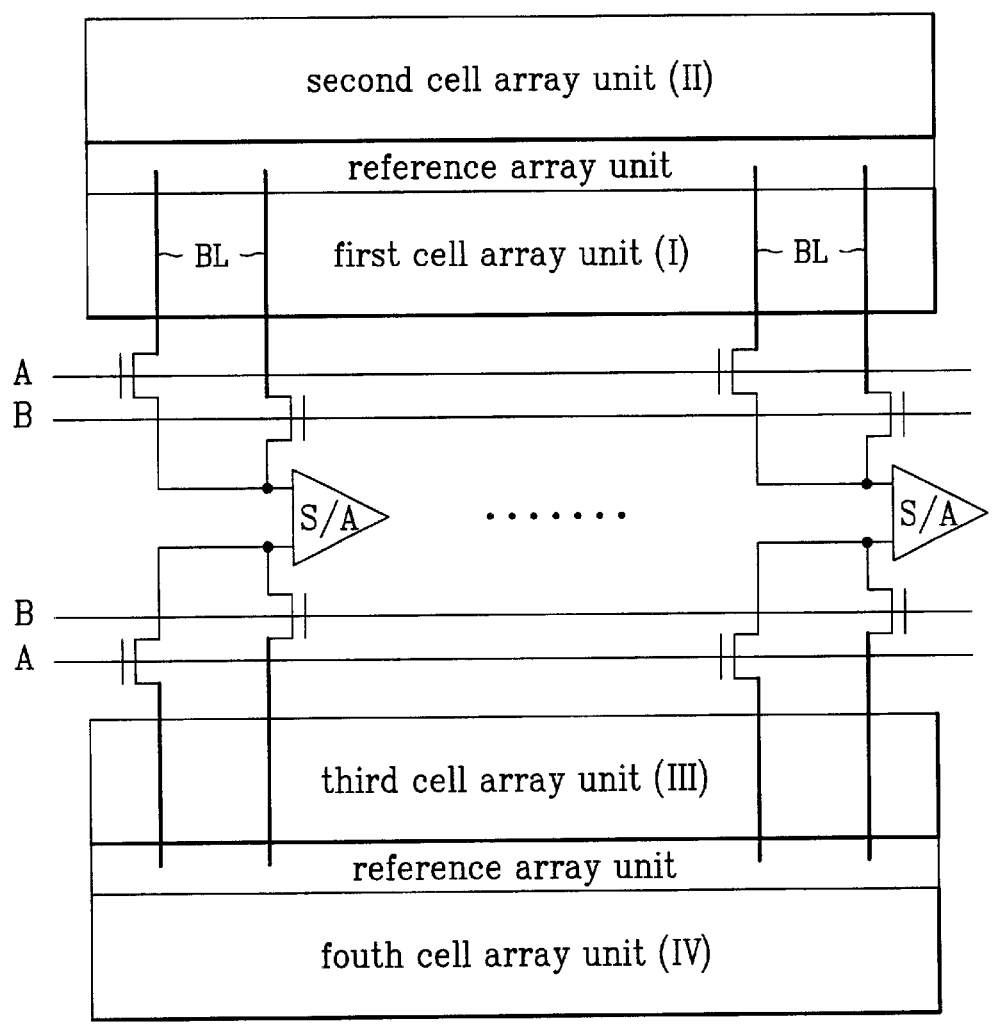

A nonvolatile ferroelectric memory device having a folded bit line cell array according to a second embodiment of the present invention is explained as follows. Referring to FIG. 11A and FIG. 11B, a cell array unit has a folded bit line structure, and includes first and second cell array units I and II at a top section, third and fourth cell array units III and IV at a bottom section, the top and bottom section disposed symmetrically about the row of sense amplifiers S/A, and reference array units between the first and second cell array units and between the third and fourth cell array units, respectively.

Two bit lines of each of the cell array units share one of the sense amplifiers S/A, and two bit lines of the adjacent cell array unit share the same sense amplifier S/A. Specifically, two bit lines BL and/BL of the first cell array unit share a single sense amplifier, two bit lines/BL and BL of the third cell array unit share the same sense amplifier, and each bit line of the second cell array unit corresponding to the first cell array unit share the same sense amplifier. In this case, if the bit line of the first cell array unit in the top section is used as a main bit line, the bit line of the third cell array unit in the bottom section is used as a reference bit line. The connection between the respective bit lines and sense amplifiers is controlled through switching NMOS transistors, and corresponding bit lines of the top and bottom sections are selected one at a time by an 'A' or 'B' selection signal.

Figure 12:
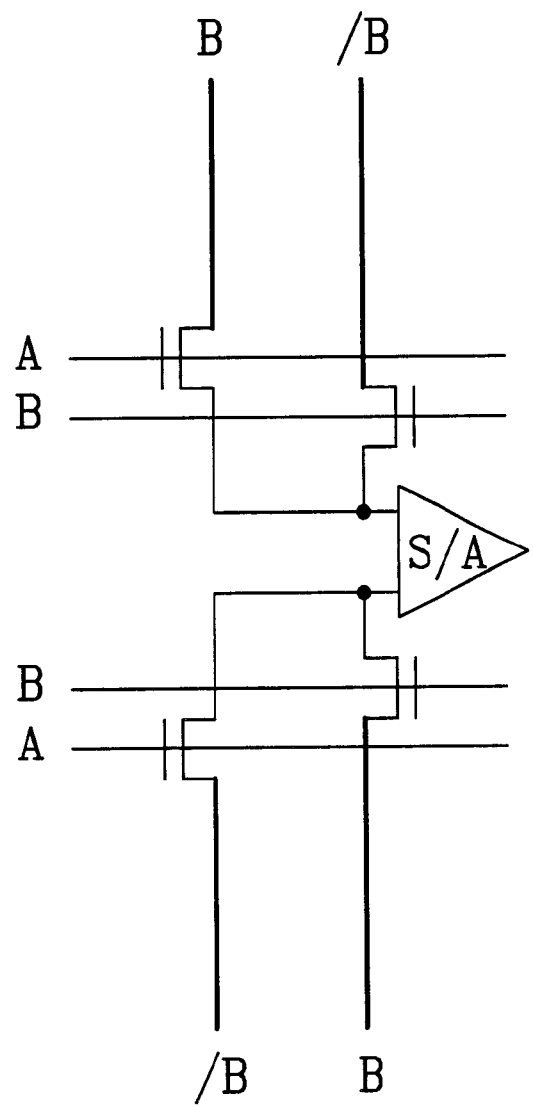
FIG. 12 illustrates a structural diagram of a hybrid bit line shown in FIG. 11A and FIG. 11B.

The above-explained structure for the cell array and the sensing system is defined as a hybrid bit line structure (cf. FIG. 12). In the hybrid bit line structure, the cell array has the folded bit line structure and the data sensing is processed through an open bit line structure. Thus, the hybrid bit line structure is used to resolve all the problems associated with folded and open bit lines. Specifically, in the folded bit lines structure, main data and reference data occur alternately. In contrast, in the open bit lines structure, all the bit lines on one side of the sense amplifiers become main bit lines while the bit lines on the other side of the sense amplifiers become reference bit lines.

The folded bit lines architecture is disadvantageous in that variations of the reference data become excessive due to a coupling noise component of the main data. The open bit lines architecture shields the reference data from the coupling noise of the main data but increases the coupling noise between the main bit lines.

In order to overcome the above-mentioned problems, the cell array is constructed with the folded bit line layout while the bit lines follow the open architecture. Specifically, the bit line of the cell array unit corresponding to the main bit line symmetrical about the sense amplifier is used as a reference bit line instead of using the reference bit line adjacent to the main bit line of the related art as a reference bit line, thereby reducing the coupling noise of the reference and main data to improve a sensing margin thereof.

Figure 13:
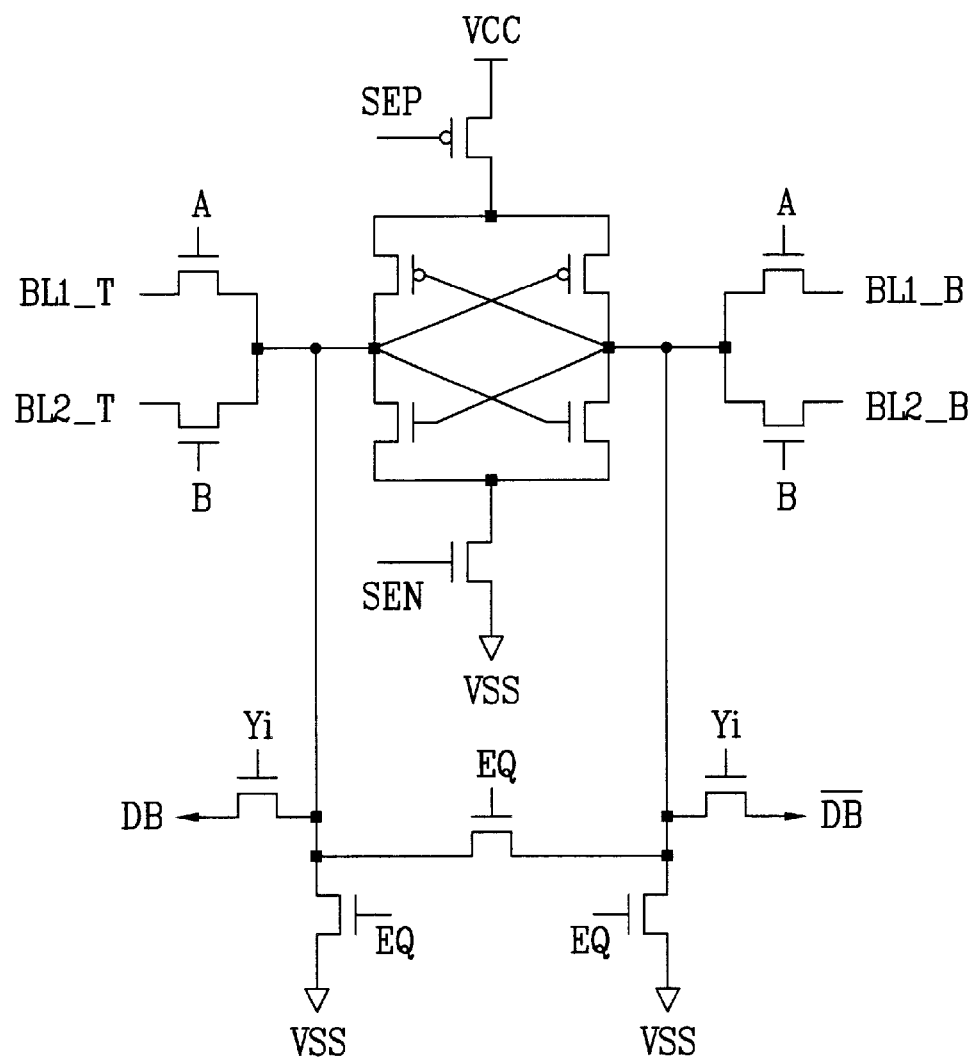
FIG. 13 illustrates a detailed circuit of a sense amplifier depicted in FIG. 11A and FIG. 11B.

FIG. 13 illustrates a detailed circuit of a sense amplifier referred to in FIG. 12. Referring to FIG. 13, two bit lines of the top and bottom cell array units share output nodes of the sense amplifier through switching transistors constituted with NMOS transistors, respectively. Specifically, BL1_T and BL2_T share one output node of the sense amplifier, while BL1_B and BL2_B share the other output node of the sense amplifier. Besides, the adjacent cell array unit has the same structure.

When BL1_T is connected to one node of the sense amplifier S/A by an 'A' signal, a reference bit line BL1_B is connected to an opposite node of the sense amplifier S/A. When BL2_T is connected to one node of the sense amplifier S/A by a 'B' signal, a reference bit line BL2_B is connected to an opposite node of the sense amplifier S/A. In this case, the sense amplifier has a latch type structure. In this latch type sense amplifier, an NMOS transistor is formed between the output nodes to receive an equalizer signal. NMOS transistors are formed between the output nodes and data buses DB and/DB to be controlled by a column selector signal Yi, respectively. NMOS transistors are also formed between the output nodes and a ground voltage terminal VSS to be controlled by the equalizer signal, respectively. The above-structured sense amplifier is applied to the nonvolatile ferroelectric memory device having the cell array of the folded bit line structure.

Figure 14:
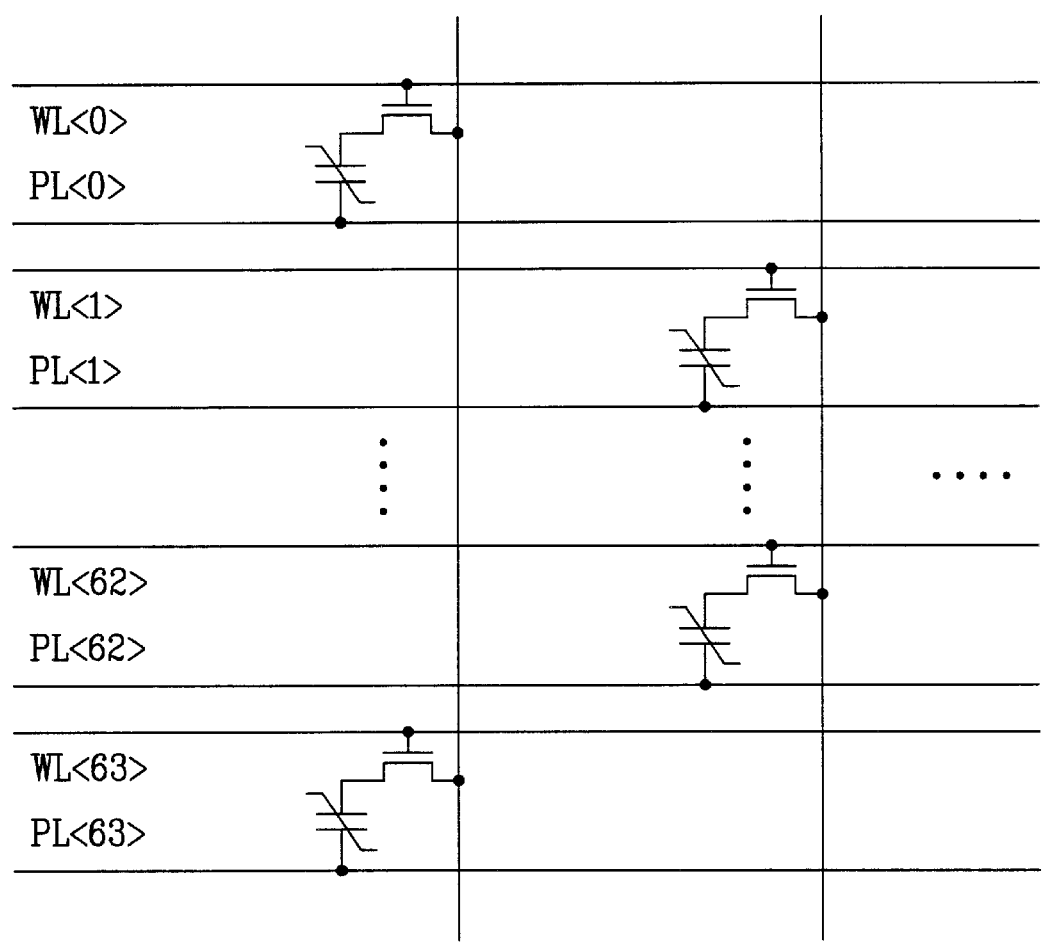
FIG. 14 illustrates a circuit for a cell array depicted in FIG. 11A and FIG. 11B according to a first method.

Next, the structure of a circuit of the folded bit line structured cell array unit referred to in FIG. 11A and FIG. 11B is explained as follows. FIG. 14 depicts a first example of a cell array structure. The cell array structure includes a plurality of pairs of word lines and plate lines disposed in parallel with each other, and a plurality of bit lines disposed in a direction perpendicular to the pairs of the word lines and plate lines. In this case, cells connected to the bit lines and word lines are disposed so that they do not overlap with each other when the cell array is folded symmetrically about the bit line. The example depicted in FIG. 14 corresponds to a structure having 64 rows.

Figure 15:
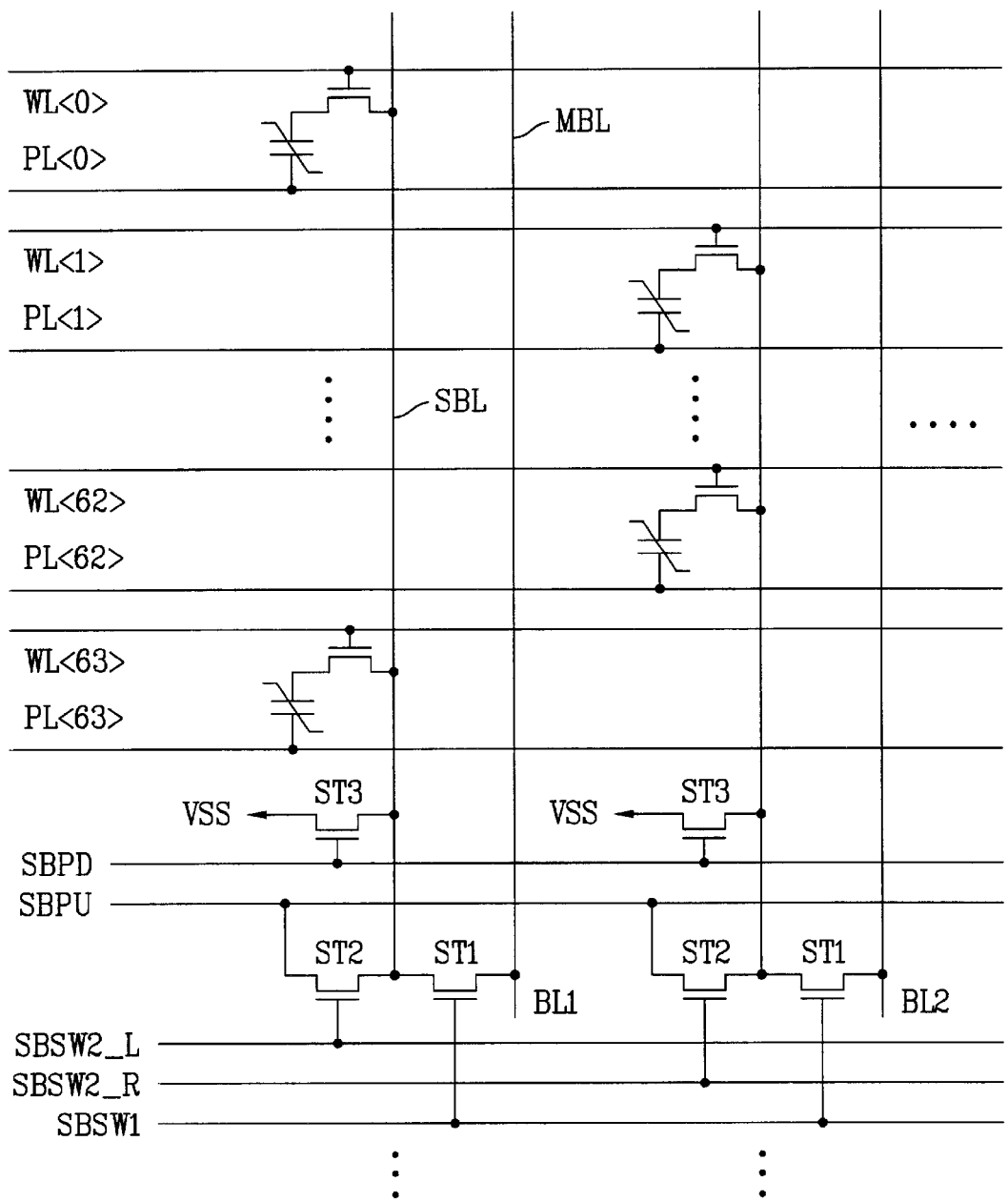
FIG. 15 illustrates a circuit for a cell array depicted in FIG. 11A and FIG. 11B according to a second method.

A cell array having a hierarchical cell array structure according to a second example, as shown in FIG. 15, includes a plurality of parallel main bit lines MBL<0>, MBL<1>, ..., MBL<n> and a plurality of sub-bit lines SBL<0>, SBL<1>, ..., SBL<n> disposed in the same direction as the main bit lines MBL<0>, MBL<1>, ..., MBL<n> and connected to unit cells in each cell array. The cell array further includes pairs of word lines/plate lines W/L<0>, P/L<0>, W/L<n>, P/L<n> disposed in a direction perpendicular to the main bit lines MBL<0>, MBL<1>, ..., MBL<n>. In the particular case where each cell array consists of 64 rows and 64 columns, each sub-cell array block includes a plurality of cells in a plurality of row and column directions. A cell is disposed at every other column along each row, and a cell is disposed at every other row along each column.

The hierarchical cell array structure includes a sub-bit line pull-down signal applying line (SBPD), a first sub-bit line switch signal applying line (SBSW1), a second right/left sub-bit line switch signal applying lines (SBSW2_R, SBSW2_L), and a sub-bit line pull-up signal applying line (SBPU). The signal applying line SBPD runs parallel to the pairs of the word lines/plate lines W/L<0>, P/L<0>, ..., W/L<n>, P/L<n>.

The cell array further includes a plurality of switching control blocks. Each switching block is controlled by the SPD, SBSW1, SBSW2_L, SBSW2_R and SBPU signal applying lines. Each switching block is designed to correspond to one main bit line and one sub-bit line. Accordingly, the switching block controls whether a selected cell is connected to the main bit line or the sub-bit line, and controls a voltage to be transferred to a ferroelectric capacitor of the selected cell.

In this configuration, a unit switching control block includes first to third switching transistors ST1, ST2, and ST3. The first switching transistor ST1 includes a gate connected to the SBSW1 applying line and two electrodes connected to the main bit line and sub-bit line, respectively. The second switching transistor ST2 at the left side of the main bit line includes a gate connected to the SBSW2_L applying line and two electrodes connected to the sub-bit line and SBPU applying line, respectively. The second switching transistor ST2 at the right side of the main bit line includes a gate connected to the SBSW2_R applying line and two electrodes connected to the sub-bit line and SBPU applying line, respectively. Moreover, the third switching transistor ST3 includes a gate connected to the SBPD applying line and two electrodes connected to the sub-bit line and ground voltage terminal VSS, respectively. If one of two sub-bit lines SBL adjacent to each other is used as a data line, the other is used as a dummy reference line. Therefore, a load on the bit line can be lowered to the level of a sub-bit line load.

Moreover, the SBL adjusts an SBL signal to a ground voltage level when an SBPD signal is activated by a signal of the SBPD applying line. The SBPU, SBSW2_L, and SBSW2_R signals are used to adjust the power applied to the SBL. A voltage higher than a voltage of VCC is generated to supply a "low" voltage when "high" voltage is generated.

Figure 16:
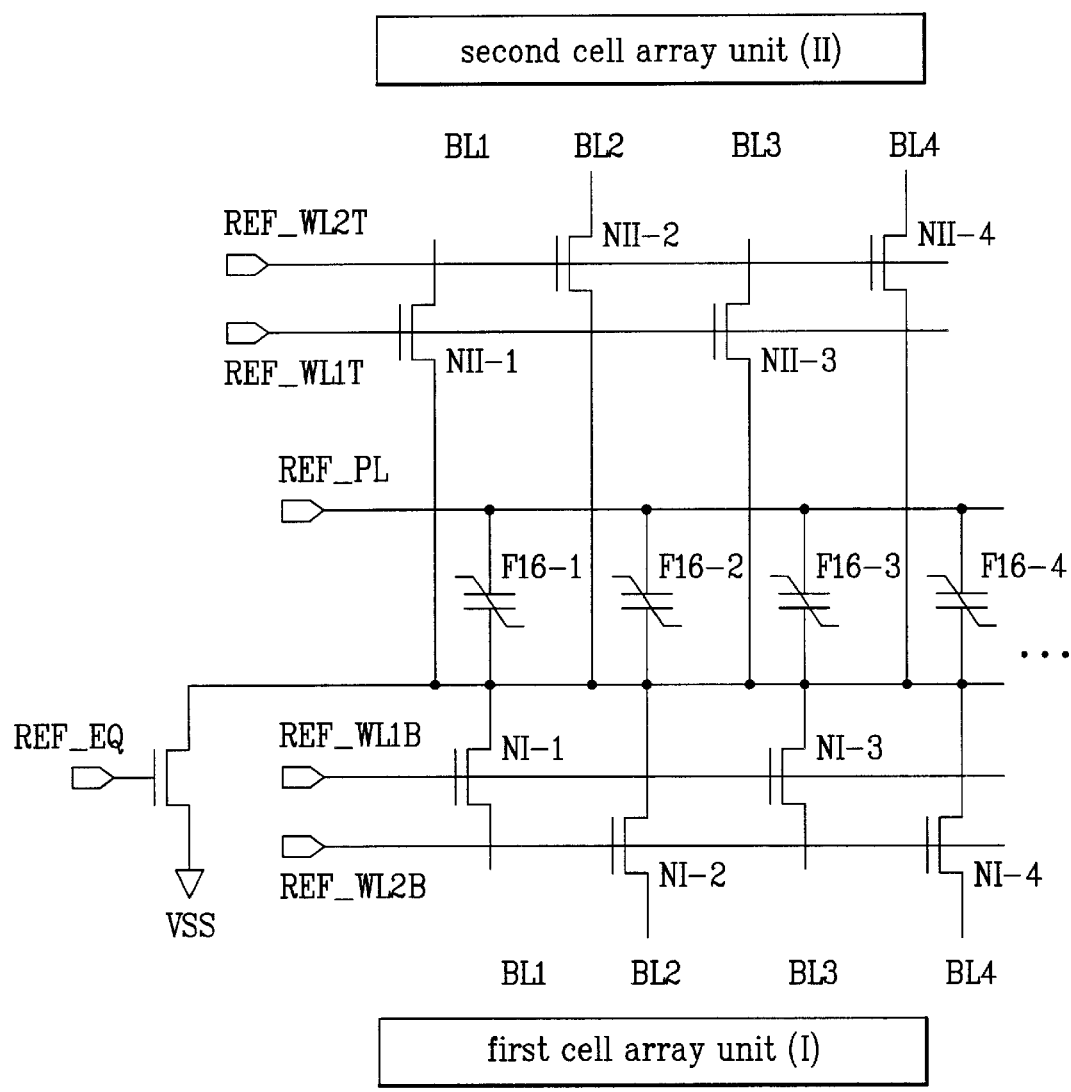
FIG. 16 illustrates a circuit for a reference array unit depicted in FIG. 11A and FIG. 11B according to a first method.

The circuit structure of the reference array unit in the cell array unit in FIG. 11B is explained as follows. For example, the reference array unit lies between the first and second cell array units I and II in the top section. The reference array unit, as shown in FIG. 16, includes a plurality of reference capacitors F16-1, F16-2, F16-3, F16-4, ..., F16-n, a plurality of NMOS switching transistors NI-1, NI-2, NI-3, NI-4, ... connected to a first cell array unit I, a plurality of NMOS switching transistors NII-1, NII-2, NII-3, NII-4, ... connected to a second cell array unit II, and a level initialization unit operating by receiving a reference equalizer signal. A plurality of the reference capacitors F16-1, F16-2, F16-3, F16-4, ..., F16-n, are connected in parallel with each other with their first electrodes connected to the reference plate line REF_PL and their second electrodes connected to the reference line as a storage node.

A plurality of the NMOS switching transistors NI-1, NI-2, NI-3, NI-4, ... connected to the first cell array unit I are constructed between the bit lines of the first cell array unit I, respectively to correspond one-to-one to a plurality of the ferroelectric capacitors. Odd numbered NMOS transistors NI-1, NI-3, NI-5, ... and even numbered NMOS transistors NI-2, NI-4, NI-6, ... are controlled by first and second bottom reference word lines REF_WL1B and REF_WL2B, respectively. A plurality of the NMOS switching transistors NII-1, NII-2, NII-3, NII-4, ... connected to the second cell array unit II are constructed between the bit lines of the second cell array unit II, respectively to correspond one-to-one to a plurality of the ferroelectric capacitors. Odd numbered NMOS transistors NII-1, NII-3, NII-5, ... and even numbered NMOS transistors NII-2, NII-4, NII-6, ... are controlled by first and second top reference word lines REF_WL1T and REF_WL2T, respectively.

Figure 17:
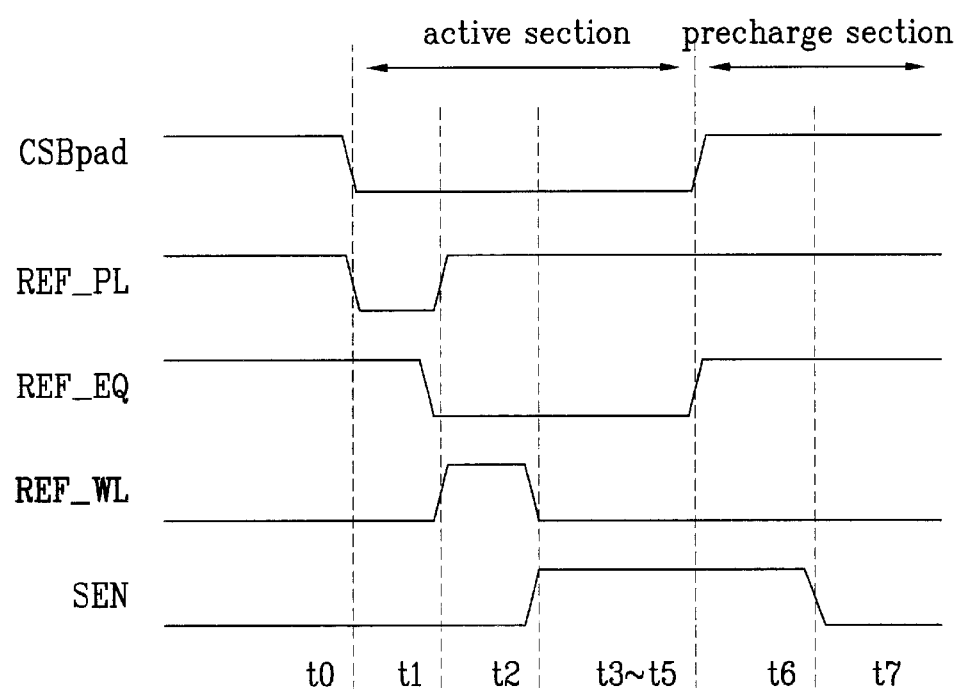
FIG. 17 illustrates an operation timing diagram for FIG. 16.

FIG. 17 depicts the operation of the above-constituted reference array unit when one of signal lines REF_WL1T, REF_WL2T, REF_WL1B and REF_WL2B is activated. REF_WL1T and REF_WL2T are respectively the first and second top reference word lines; REF_WL1B and REF_WL2B are respectively the first and second bottom reference word lines. The operation described in FIG. 17 is similar to that of the reference array unit depicted in FIG. 9.

Figure 18A:
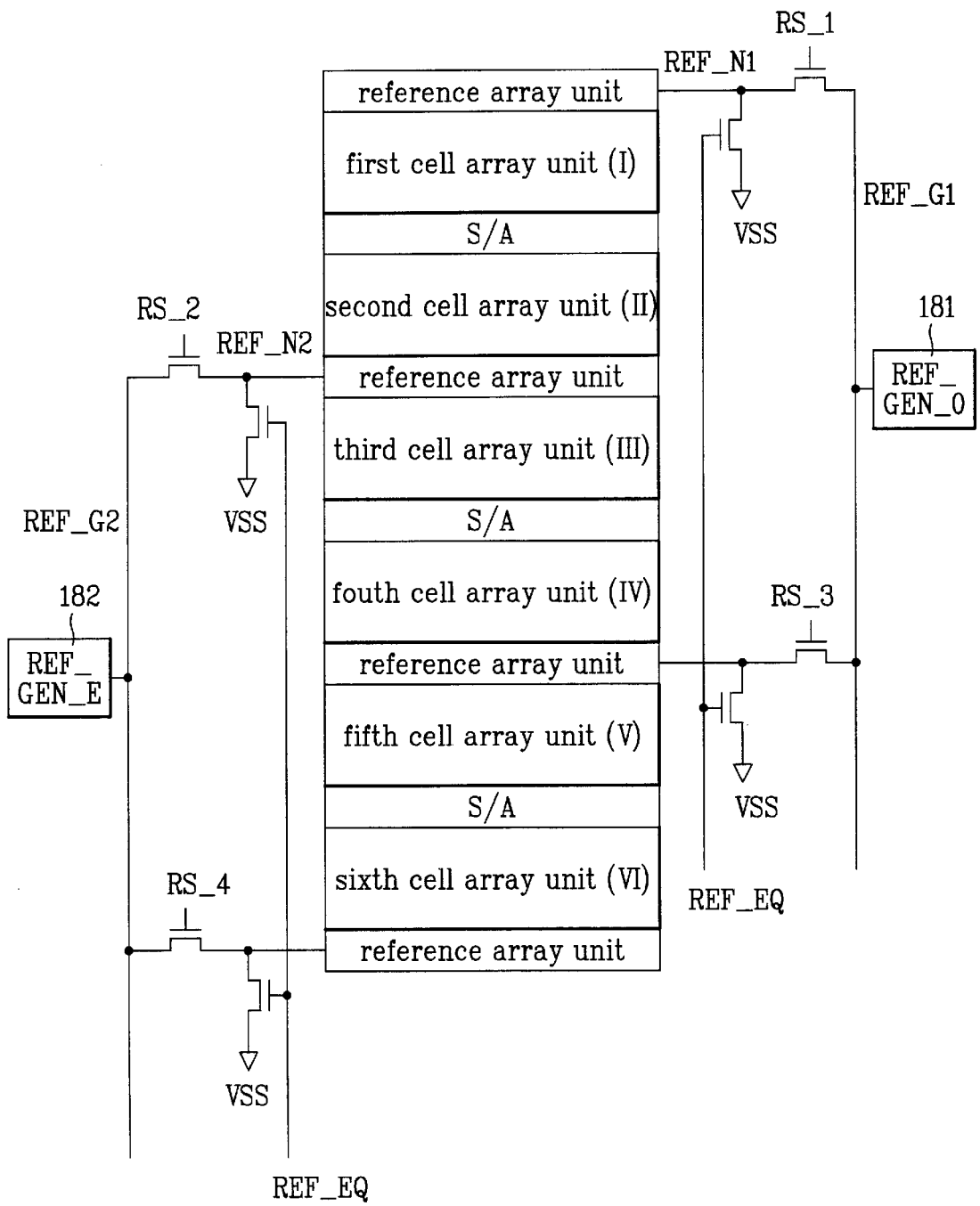
FIG. 18A illustrates a schematic block diagram of a nonvolatile ferroelectric memory device having a reference generation unit for controlling a reference array unit according to a first method.

As mentioned in the foregoing description, the reference array unit can be structured to control the reference level internally or externally. A nonvolatile ferroelectric memory device performing such operation is explained as follows. A sense amplifier unit S/A, as shown in FIG. 18A, is disposed between pairs of adjacent cell arrays. Reference array units are disposed at each sides of the cell array unit where the sense amplifier is lacking. In this case, the cell array may have one of the hybrid bit line (B/L) cell array structure and other cell array structures (for example open bit line structure, split word line structure, open and folded bit line structures in hierarchical bit line structures).

Each reference array unit is designed to supply a reference level for each reference selection signal RS in a such manner that the top and bottom sections symmetrical about the sense amplifier are divided into odd and even orders, respectively. Specifically, each of the odd reference array units is controlled by switching and pull-down transistors to be supplied with the reference level generated through an odd reference generation unit REF_GEN_O 181. In this case, the respective switching transistors connected to the odd reference arrays are activated by first and third reference selection signals RS_1, RS_3, ..., respectively. Moreover, the pull-down transistor is activated by a reference equalizer signal REF_EQ.

Similarly, the even reference arrays are controlled by the switching and pull-down transistors, respectively to be supplied with the reference level generated through an even reference generation unit REF_GEN_E 182. In this case, the respective switching transistors connected to the even reference arrays are activated by receiving second and fourth reference selection signals RS_2, RS_4, ..., respectively. Moreover, the pull-down transistor is activated by the reference equalizer signal REF_EQ. The reference is applied simultaneously to the top/bottom cell array units symmetrical about the sense amplifier unit in RS_1, RS_2, . . .

Moreover, a signal entering the selected cell array unit is used as a dummy reference signal, while a signal entering the cell array unit opposite with respect to the S/A is used as a reference signal. The reference and dummy reference signals are shielded from mutual interference by using independent reference generation circuits.

Figure 18B:
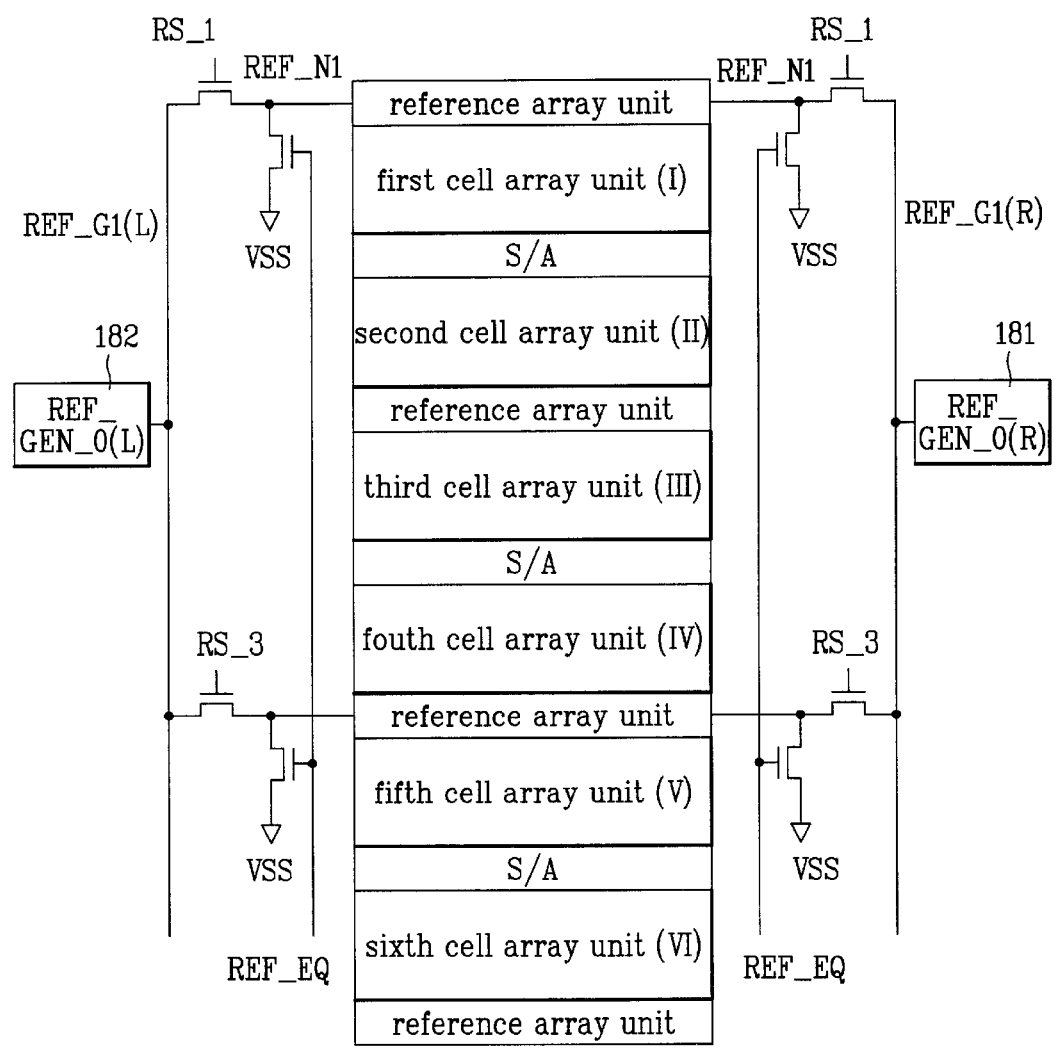
FIG. 18B and FIG. 18C illustrate schematically structures of nonvolatile ferroelectric memory devices according to the second and third methods.
Figure 18C:
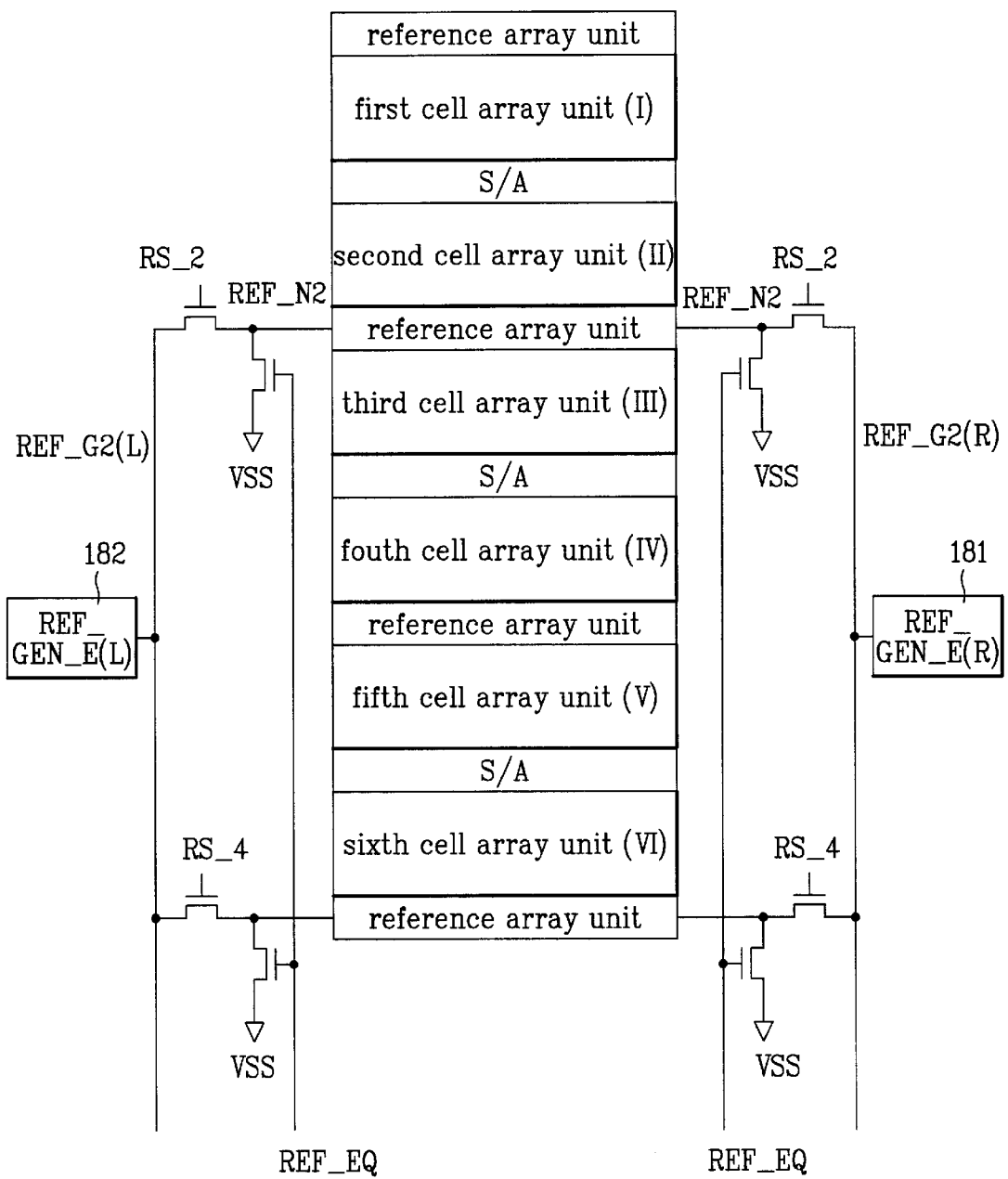

As shown in FIG. 18B and FIG. 18C, when the reference level is controlled externally, switching transistors, pull-down transistors, and reference generation units can be disposed at both right and left sides of the odd and even numbered reference array units, respectively. Therefore, a transfer speed of the reference level to the reference array unit can be reduced.

Figure 19:
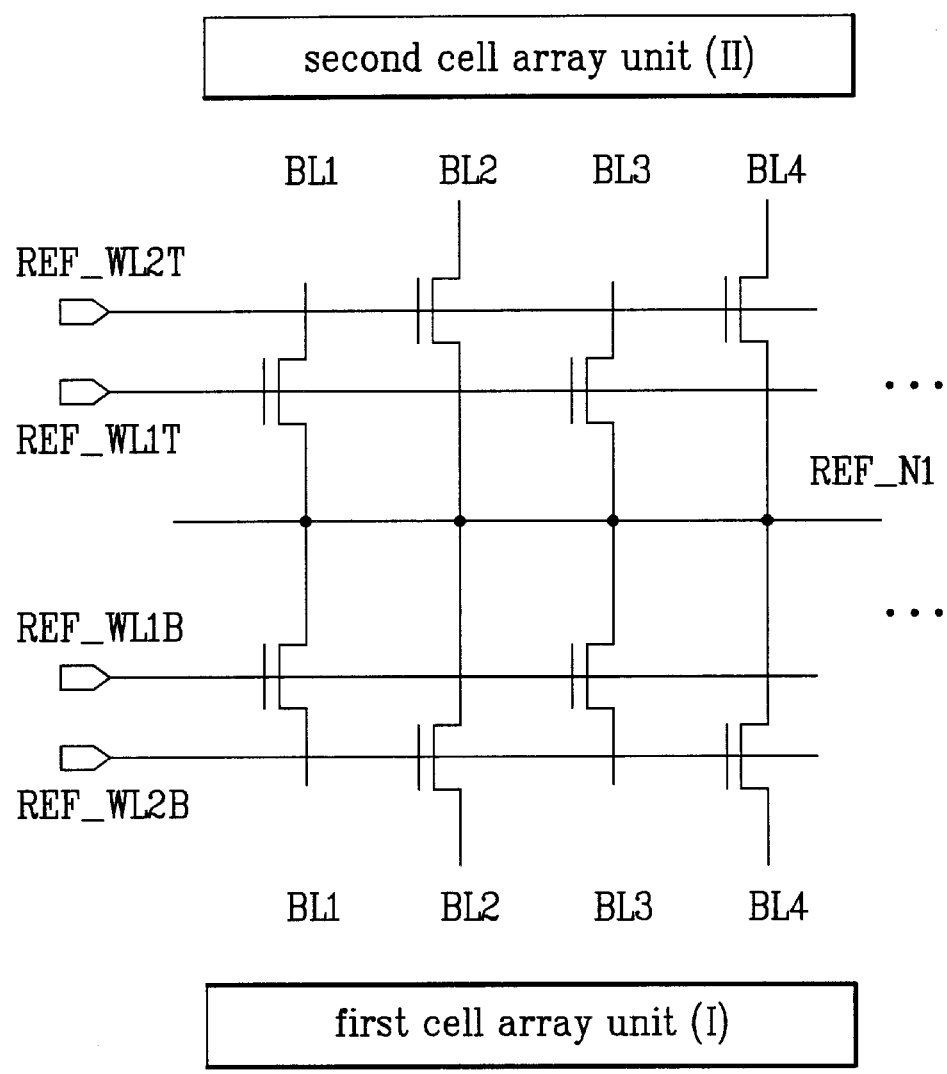
FIG. 19 illustrates a circuit for a reference array unit depicted in FIG. 18A according to a first method.

As shown in FIG. 19, the internal circuit of the reference array unit in each of the nonvolatile ferroelectric memory devices described in FIG. 18A to FIG. 18C includes a reference line disposed in one direction to output a reference level to a reference node REF_N1, a plurality of bit lines BL1~BLn connected to a first cell array unit I in a direction perpendicular to the reference line REF_N1, a plurality of bit lines BL1~BLn connected to a second cell array unit II in a direction perpendicular to the reference line REF_N1, a plurality of switching transistors controlling a plurality of the upper and lower bit lines to be connected to each other selectively, and first and second top reference word lines REF_WL1T and REF_WL2T and first and second bottom reference word lines REF_WL1B and REF_WL2B disposed in a direction in parallel with the reference line REF_N1 to turn on/off a plurality of the switching transistors selectively.

Specifically, the internal circuit of the reference array in FIG. 19 is similar to that inside the reference array in FIG. 16 except that a plurality of the ferroelectric capacitors and the level initialization unit are excluded from the latter.

Figure 20:
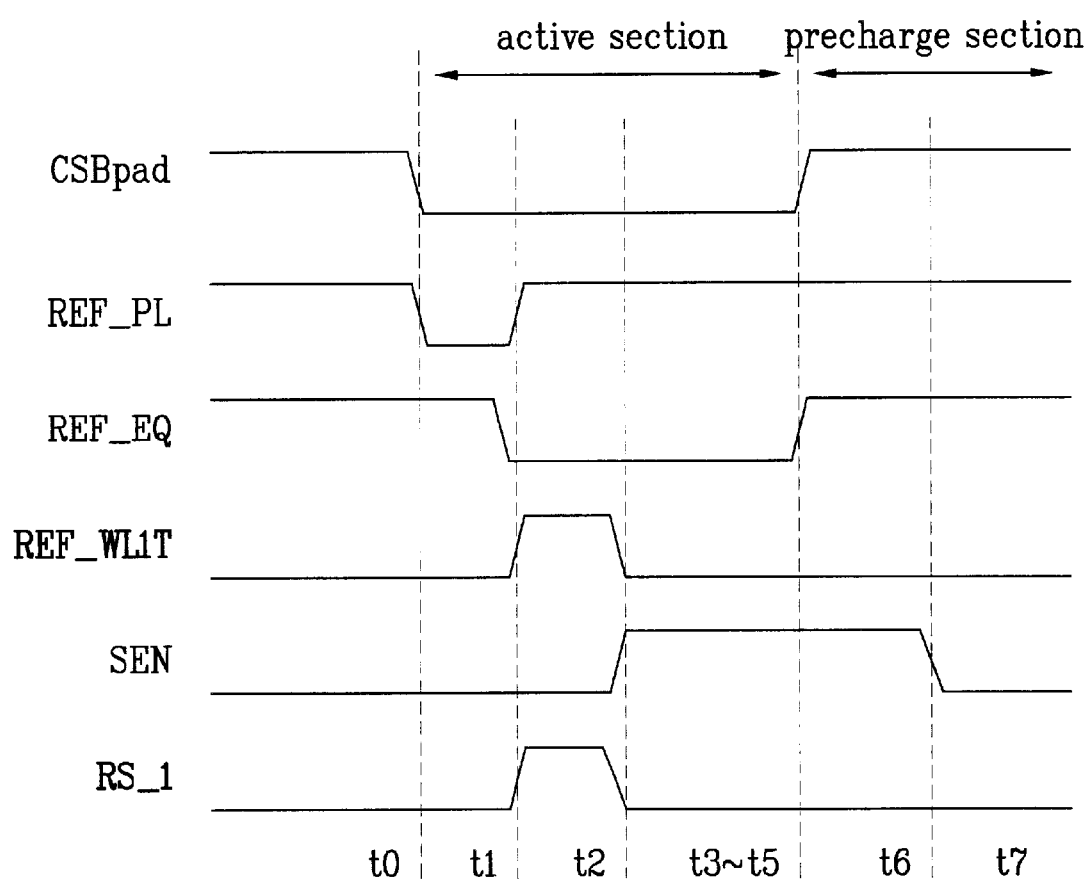
FIG. 20 illustrates an operation timing diagram of a reference array unit referred to in FIG. 18A and FIG. 19.

Operation of such a circuit is depicted in FIG. 20 and is explained as follows. A reference plate line REF_PL shows "low" level only for a t1 section where an active section begins, the first top reference word line REF_WL1T shows "high" level for a t2 section only, and a switching signal RS_1 is activated into "high" level for the t2 section to output a signal to the first odd reference array unit.

A chip enable signal CSBpad shows "low" level for the active section and "high" level for a precharge section. A reference cell equalizer signal REF_EQ shows "low" level for t2~t5 sections in the active section, and a sense amplifier enable signal is enabled into "high" level for t3~t6 sections.

FIG. 19 and FIG. 20 depict the case where the reference level is outputted to the first odd reference array unit through the reference node REF_N1 in FIG. 18A.

Figure 21:
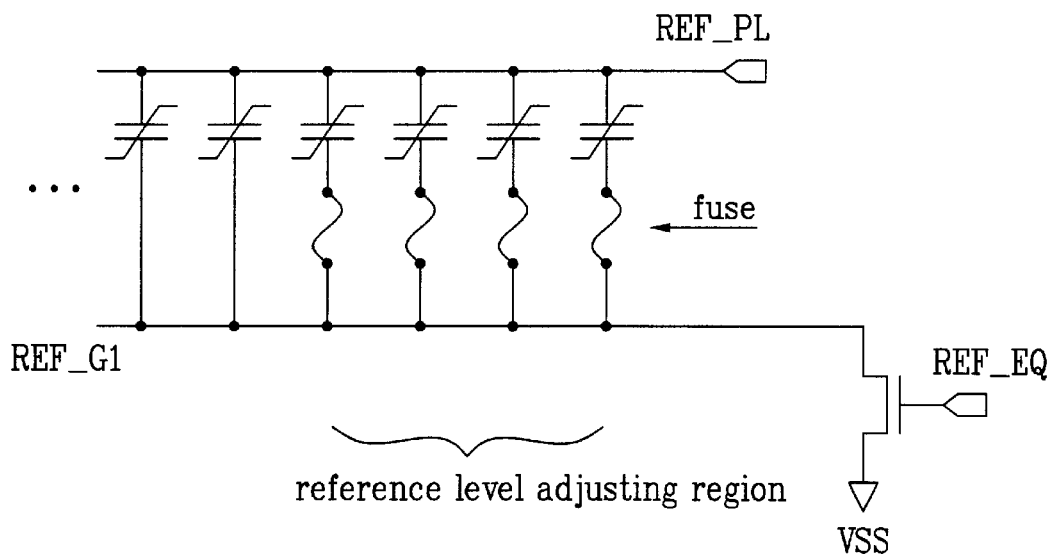
FIG. 21 illustrates a structure of a reference generation unit according to a first method.

A circuit for the odd and even reference generation units REF_GEN_O and REF_GEN_E in FIG. 18A to FIG. 18C according to a first method, as shown in FIG. 21, includes a plurality of ferroelectric capacitors, a plurality of fuses, and a level initialization unit.

First electrodes of a plurality of the ferroelectric capacitors are jointly connected to a reference plate line REF_PL, and second electrodes thereof are jointly connected to a voltage generation line REF_G1 as a storage node.

Moreover, a plurality of the fuses are disposed between the second electrodes of the ferroelectric capacitors and the reference voltage generation line REF_G1, respectively to adjust a variation of the reference level in accordance with a process variation after arrangement of the optimal ferroelectric capacitors. FIG. 21 depicts an arrangement involving four fuses.

Figure 22:
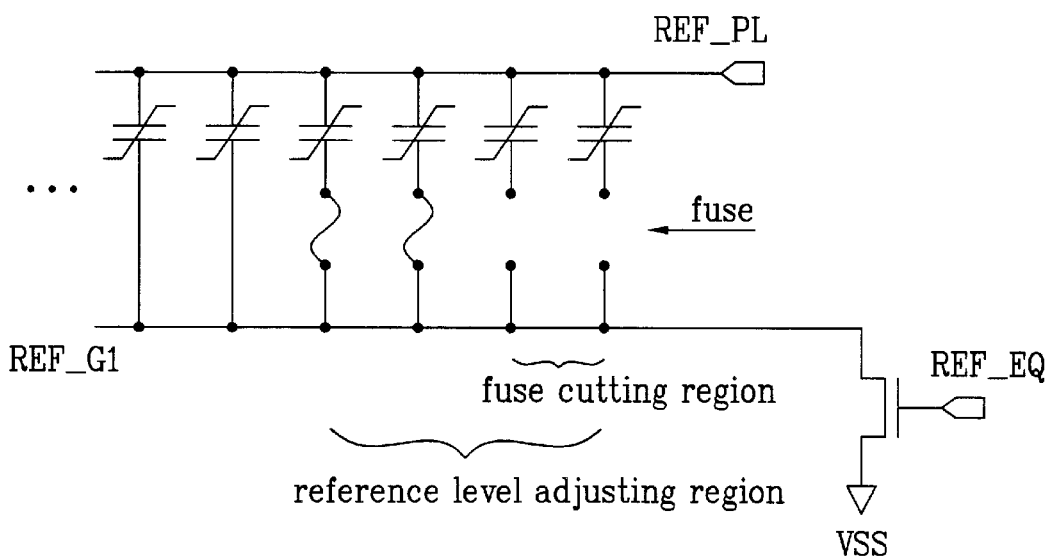
FIG. 22 illustrates a first method for driving a reference generation using fuse cutting as an example.

In the level initialization unit, a gate receives the reference equalizer signal and drain and source terminals are connected to the reference voltage generation line REF_G1 and ground voltage terminal, respectively. FIG. 22 illustrates an example where a reference level is adjusted by cutting two peripheral edges, in which the fuses are cut using laser.

Figure 23:
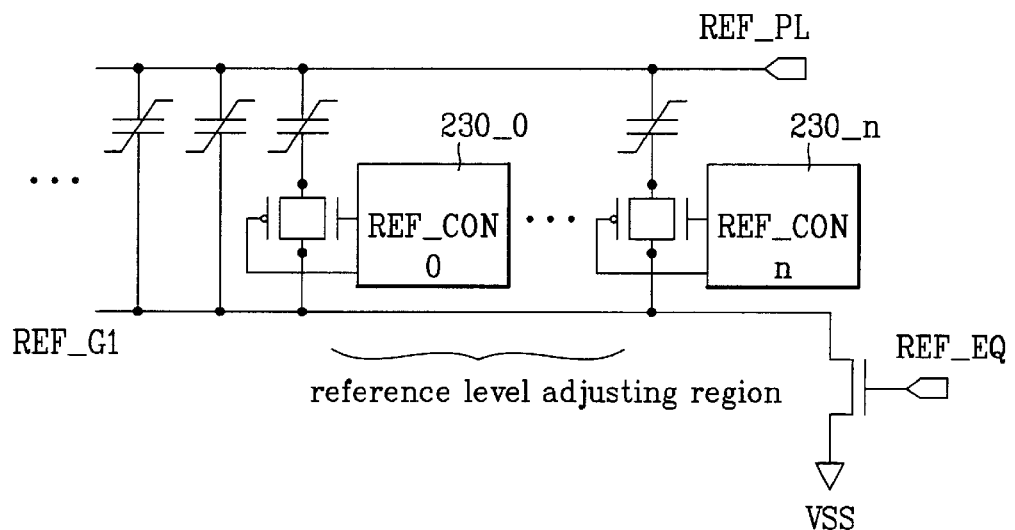
FIG. 23 illustrates a structure of a reference generation unit according to a second method.

Structure of a circuit for the odd and even reference generation units REF_GEN_O and REF_GEN_E in FIG. 18A to FIG. 18C according to a second method is explained as follows. A reference generation unit according to a second method, as shown in FIG. 23, uses a transfer gate including NMOS and PMOS transistors instead of the fuse in the first method, and further includes a plurality of reference control units 230_0~230_n to control the transfer gates, respectively.

Figure 24:
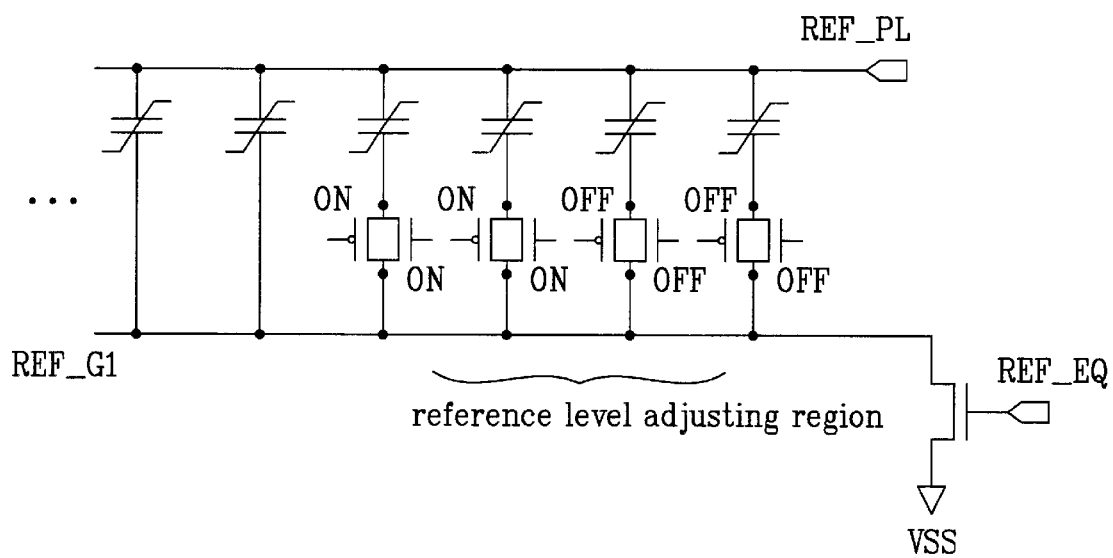
FIG. 24 illustrates a second method for driving a reference generation unit.
Figure 25:
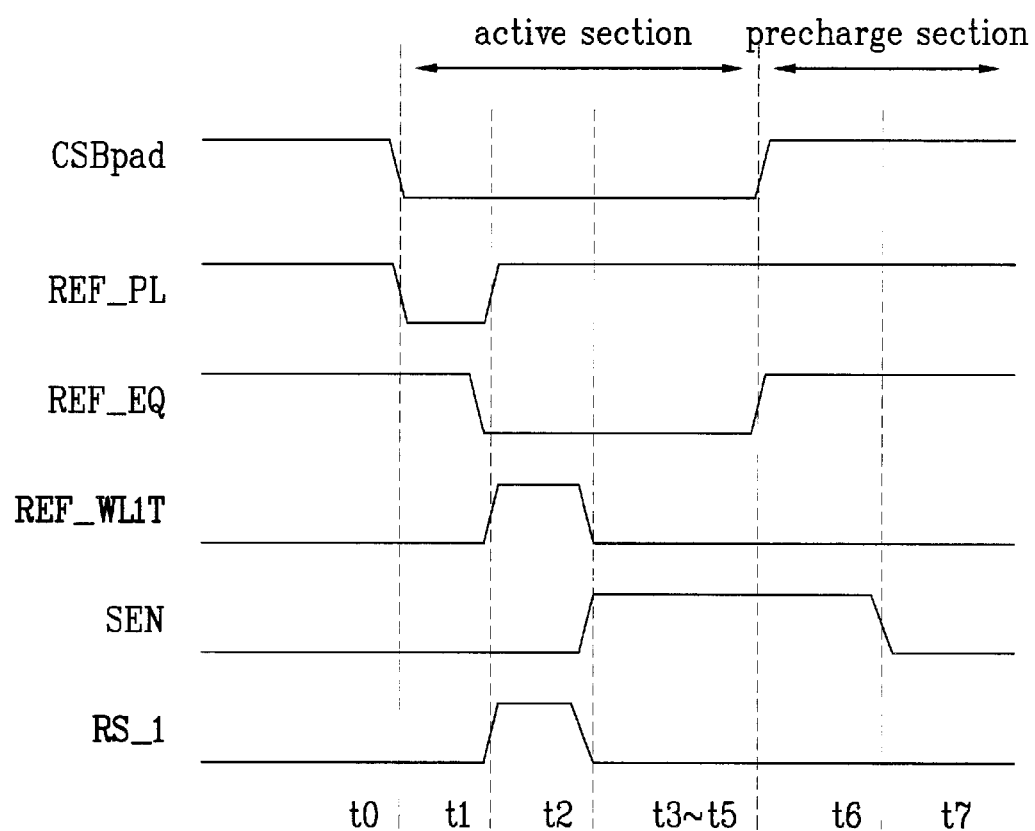
FIG. 25 illustrates an operation timing diagram of a reference generation unit according to the present invention.

FIG. 24 shows an example that two peripheral transfer gates are turned off to adjust a reference level. Levels of a plurality of reference nodes REF_N1, REF_N2, . . . and reference voltage generation lines REF_G1, REF_G2, . . . are adjusted into a ground level if a reference equalizer signal REF_EQ becomes "high" level. The timing diagram for the circuits depicted in FIGS. 21 to 23 is similar to that of the circuit from FIG. 19 as depicted in FIG. 20.

It is not possible to adjust the reference level in the related art after the process has been carried out. Consequently, it is difficult to implement 1T1C (1-transistor 1-capacitor) type FeRAM with a properly adjusted reference level.

Hereinafter, a programmable reference adjusting method for adjusting a reference level is explained. Specifically, the programmable reference level adjusting method allows changing the reference level after/before packaging or in the field of use.

In order to program such a reference level, a nonvolatile FeRAM register is used. The transfer gates and reference control units 230_0~230_n, as explained in FIG. 23, are designed to adjust the reference level.

Memory states of n reference control units, i.e. programmed states, determine whether to turn on/off the transfer gates. In this case, if the transfer gate is programmed as SET to be turned on, the reference ferroelectric capacitor is connected to the reference generation line REF_G1. If the transfer gate is programmed as RESET to be turned off, the reference ferroelectric capacitor fails to be connected to the reference generation line REF_G1.

Figure 27:
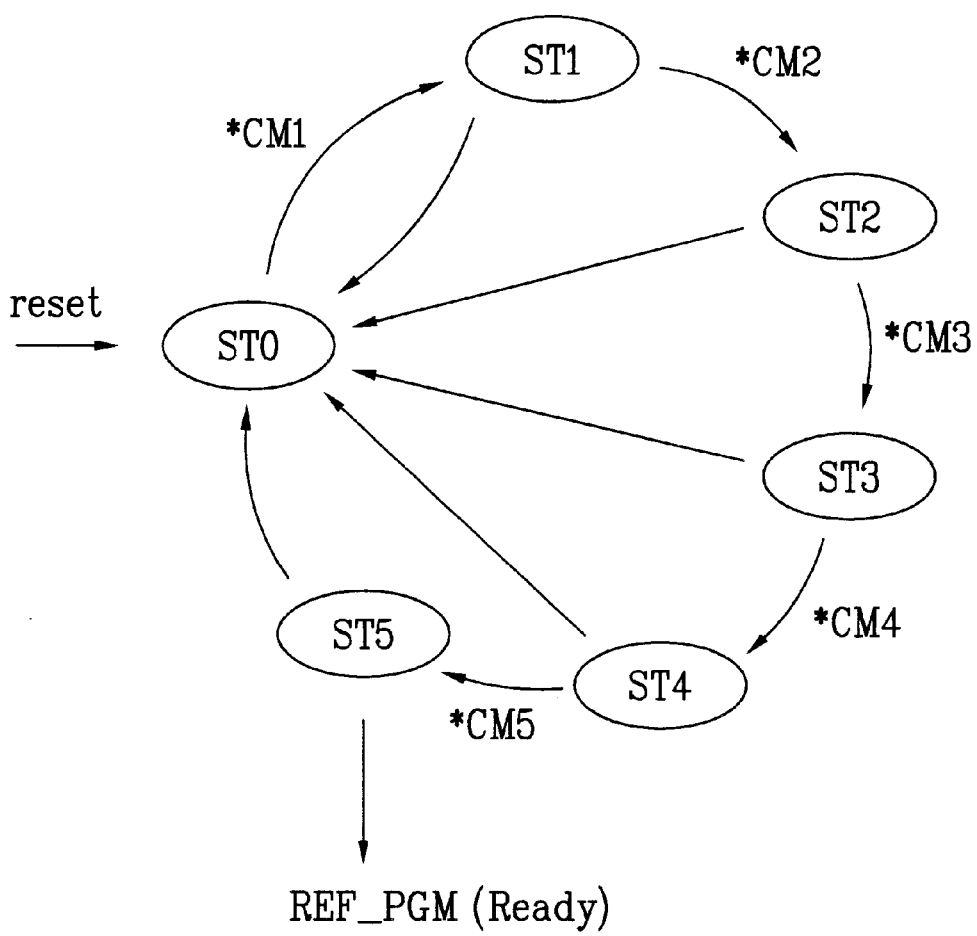
FIG. 27 illustrates a state diagram for determining whether to operate a reference program of a reference generation unit.

FIG. 27 illustrates a command processing process when a state of a reference control unit is adjusted into SET or RESET. Specifically, once a reference program signal REF_PGM is generated from the combination between six states ST0 to ST6 and commands CM1 to CM5, the state of SET or RESET can be transferred to the reference control unit.

In other words, a state diagram in FIG. 27 shows that a programmable signal of "high" level is outputted to the reference control unit only when five kinds of commands are precisely inputted sequentially to vary the reference level by programming. In this case, if one false command is inputted, the commands should be inputted all over again from the initial state ST0. Therefore, another user failing to have the proper sequence of commands is unable to change the reference level arbitrarily.

Figure 28:
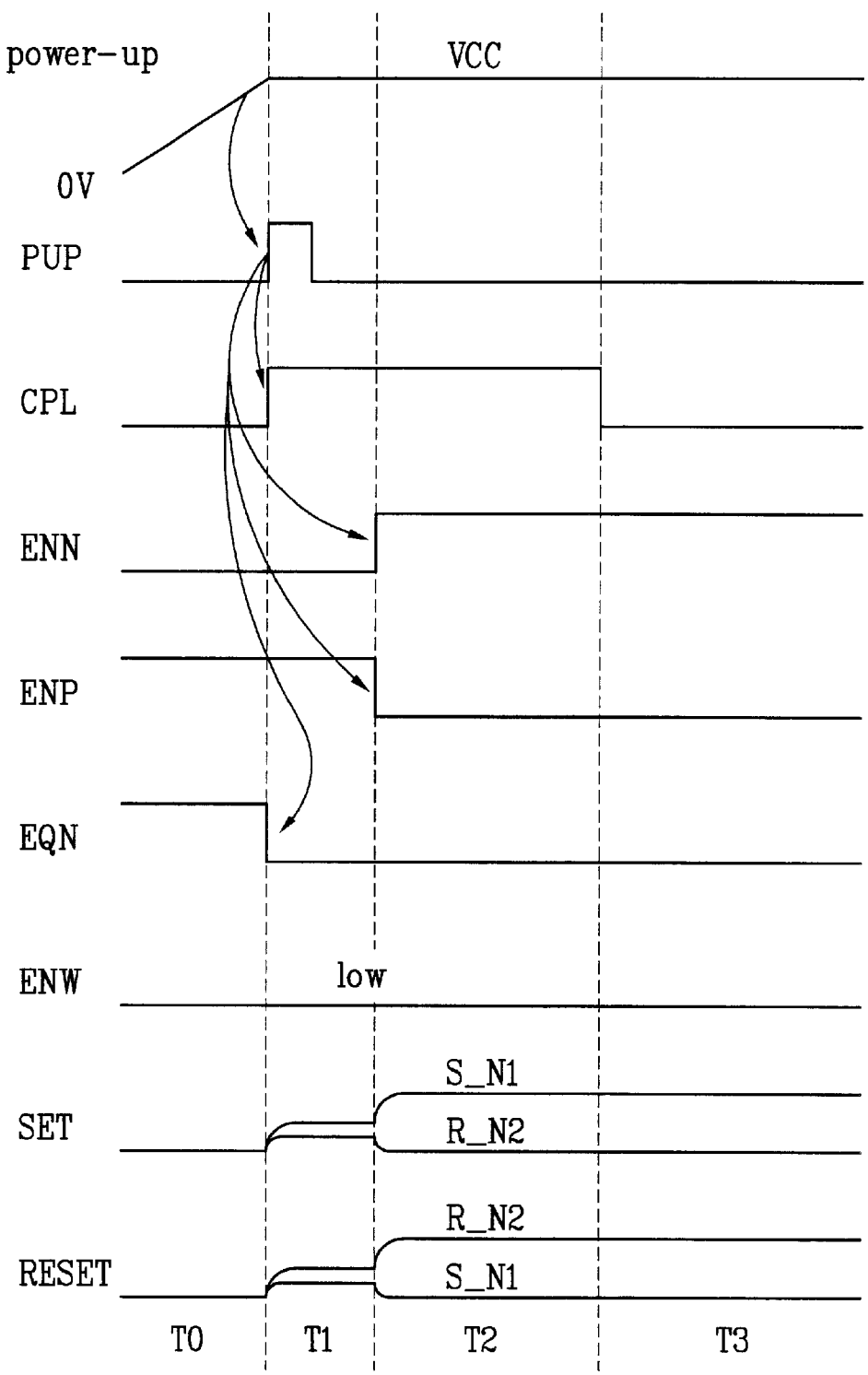
FIG. 28 illustrates an operation timing diagram for processing a command of a reference generation unit at power-up mode.

Moreover, a reset signal brings about the ST0 state on initial power-up. Operation at power-up mode for sensing a state stored in the reference control unit on initial power-up is explained as follows. Referring to FIG. 28, when power reaches a stable level, a power-up detection pulse PUP is generated. Moreover, EQN is shifted from "high" level to "low" level using the PUP to release equalization.

Thereafter, once CPL is shifted from "low" level to "high" level, charges stored in FC1 and FC2 in FIG. 26 generate a voltage difference between both end nodes S_N1 and R_N2 of a cell due to a capacitance load.

Once the voltage difference is sufficiently high, ENN and ENP are activated into "high" and "low" levels, respectively to amplify data of both ends of the cell. In this case, if SET is asserted, S_N1 and R_N2 nodes are amplified into high and low levels, respectively. If RESET is asserted, S_N1 and R_N2 nodes are amplified into low and high levels, respectively. Once the amplification is completed, CPL is shifted back to "low" level to restore the destroyed "high" data of FC1 or FC2. In this case, ENW is deactivated into "low" level to prevent external data from being rewritten.

Figure 29:
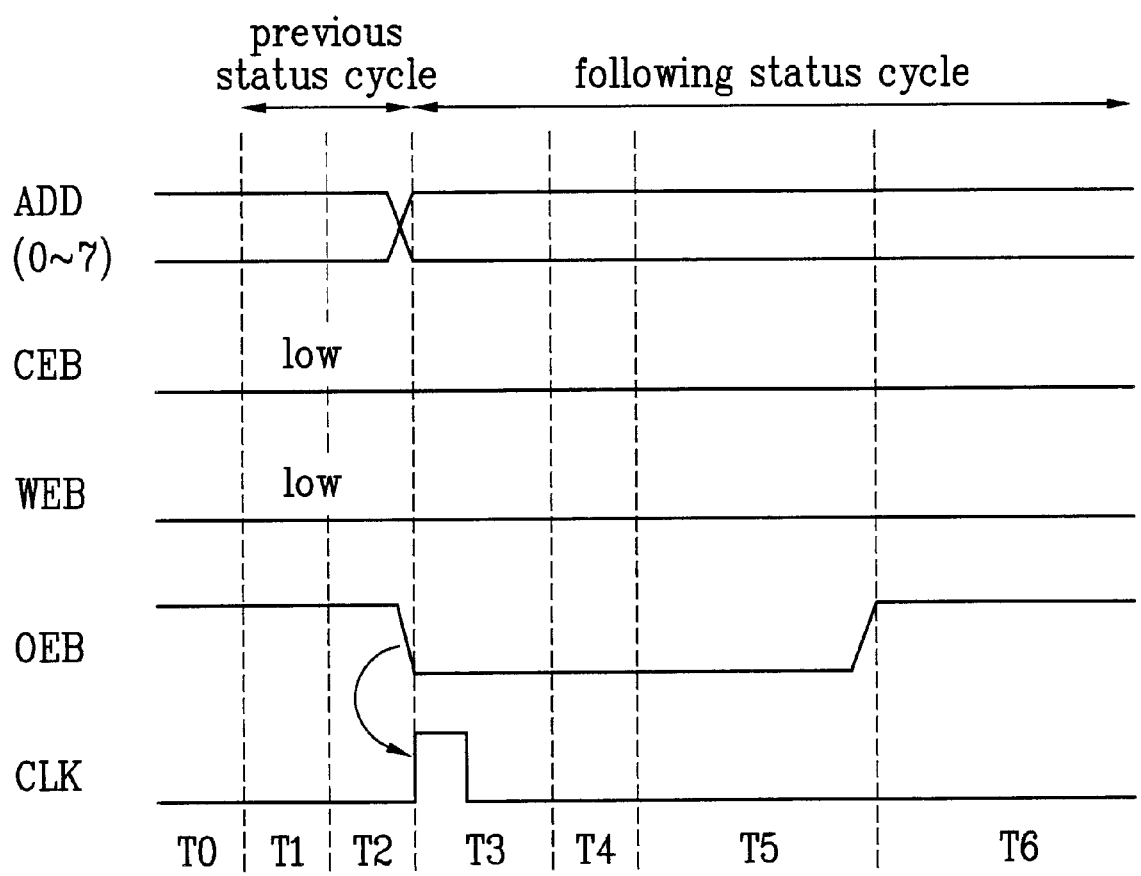
FIG. 29 illustrates a clock generation timing diagram for processing a command of a reference generation unit at state-moving mode.

Such an operation of the state diagram, as shown in FIG. 29, proceeds by the generation of a command address and a clock signal CLK. The commands CM1~CM5 are constituted with the combination of address input signals ADD. Moreover, the CLK signal is generated when an OEB (output enable bar) signal is shifted to "low" level while CEB and WEB are maintained to "low" level.

Specifically, CLK is generated when a previous state cycle is changed into a following state cycle. Such a CLK signal is uses as a trigger pulse in a moving flip-flop circuit of the state diagram. In this case, CEB and/OE are pad signals. Once the states ST0 to ST5 are sequentially achieved by the commands CM1~CM5 in the above state diagram, the reference control units are ready to generate set and reset signals, respectively. Such an operation is explained as follows.

Figure 30:
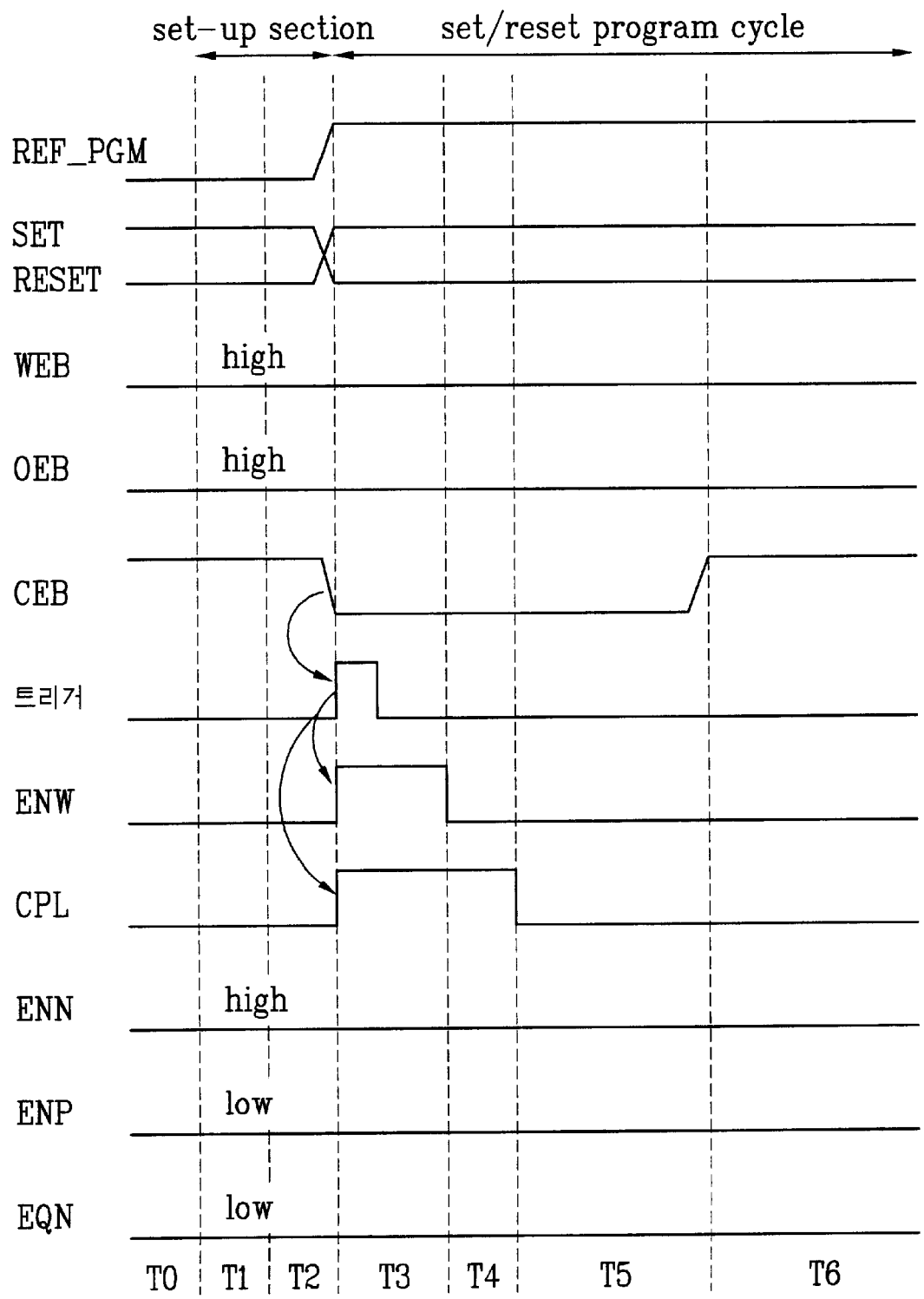
FIG. 30 illustrates an operation timing diagram for a reference control unit at set/reset mode.

Referring to FIG. 30, when the state ST5 is achieved, the reference program signal REF_PGM is shifted from "low" level to "high" level. In this case, data for SET and RESET are prepared by the respective reference control units. If CEB is shifted from "high" level to "low" level while WEB and OEB maintain "high" level, a trigger pulse is generated. Then, the trigger pulse causes SET/RESET be written on the reference control unit. ENW is shifted from "low" level to "high" level the moment the trigger pulse is generated. Moreover, CPL shows "high" level for a predetermined time period. When the above-mentioned reference control signal is generated, ENN, ENP, and EQN maintain "high", "low", and "low" levels, respectively.

Figure 26A:
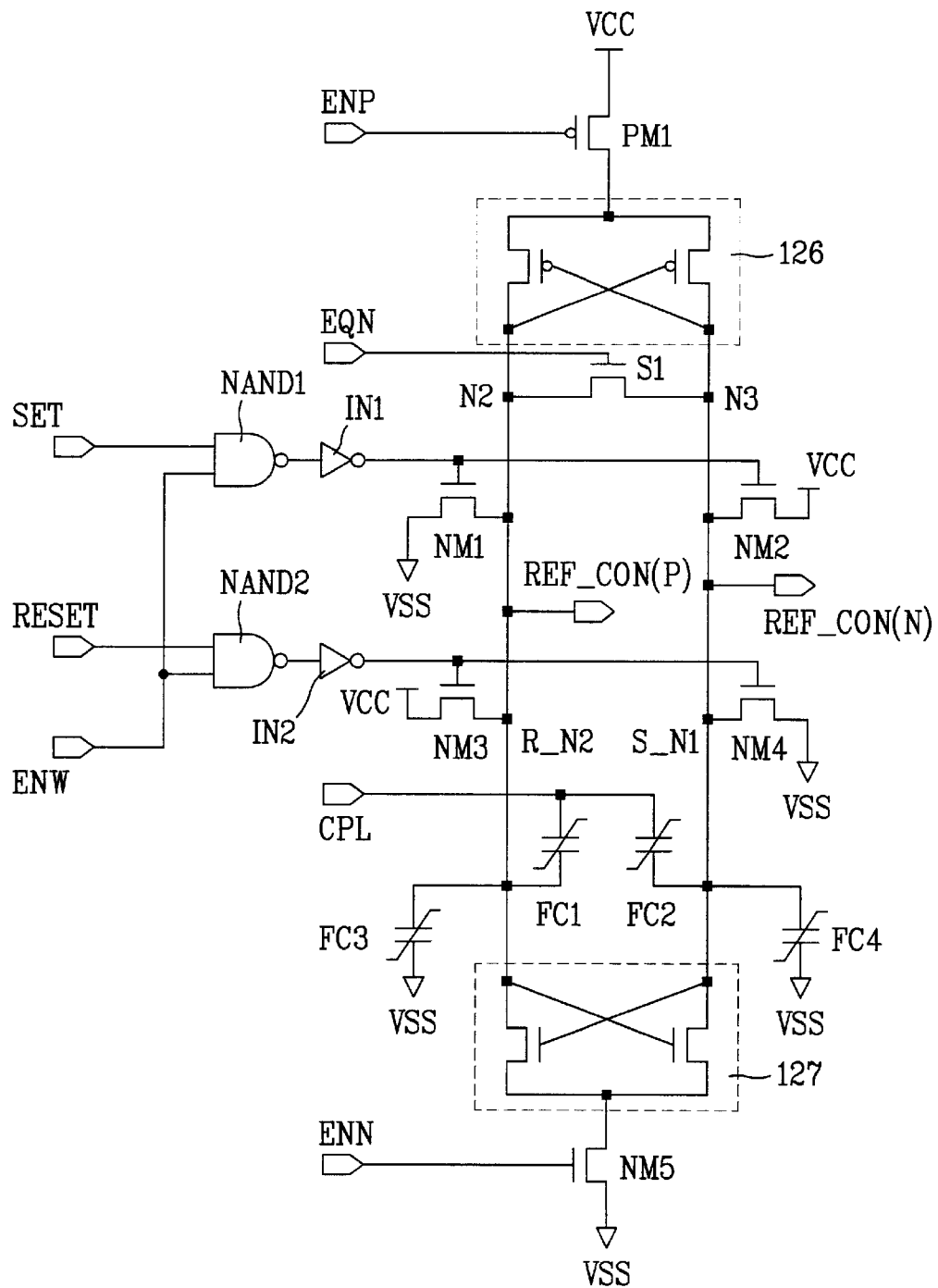
FIG. 26A illustrates a circuit for a reference control unit in FIG. 23 according to a first method.

A construction of a reference control unit, which outputs a reference control signal for adjusting a reference level, according to a first method is explained by referring to FIG. 26A as follows. A reference control unit according to a first method, as shown in FIG. 26a, includes a first logic gate NAND1 carrying out logical multiply on an ENW signal and a SET signal inputted through an external address pad to invert a corresponding logical product, a second logic gate NAND2 carrying out logical multiply on the ENW signal and a RESET signal inputted through the external address pad to invert a corresponding logical product, a first inverter IN1 inverting a signal of the first logic gate NAND1, a second inverter IN2 inverting a signal of the second logic gate NAND2, a first PMOS transistor PM1 receiving a PMOS enable signal ENP to transfer a power supply voltage VCC to a first node N1, a first latch 126 having one node connected to the first node N1 and the other nodes connected respectively to second and third nodes N2 and N3, a first NMOS switch SI receiving an equalizer signal EQN to control whether to connect the second and third nodes N2 and N3 to each other, a first NMOS transistor NM1 having gate, drain, and source terminals connected to an output terminal of the first inverter IN1, the second node N2, and a ground voltage terminal VSS, respectively, a second NMOS transistor NM2 having gate, drain, and source terminals connected to the output terminal of the first inverter IN1, the third node N3, and a power supply voltage terminal VCC, respectively, a third NMOS transistor NM3 having gate, drain, and source terminals connected to an output terminal of the second inverter IN2, an R_N2 node, and the power supply voltage terminal VCC, respectively, a fourth NMOS transistor NM4 having gate, drain, and source terminals connected to the output terminal of the second inverter IN2, an S_N1 node, and the ground voltage terminal VSS, respectively, a fifth NMOS transistor NM5 receiving an NMOS enable signal ENN to transfer a ground voltage VSS to a fourth node N4, a second latch 127 having one node connected to the fourth node N4 and the other nodes connected respectively to the R_N2 and S_N1 nodes, a first ferroelectric capacitor FC1 connected between a CPL signal input terminal and the R_N2 node, a second ferroelectric capacitor FC2 connected between the CPL signal input terminal and S_N1 node N6, a third ferroelectric capacitor FC3 connected between the R_N2 node and ground voltage terminal VSS, and a fourth ferroelectric capacitor FC4 connected between the S_N1 node and ground voltage terminal VSS.

In this case, a first reference control signal REF_CON(N) outputted to a gate end of an NMOS transistor of a transfer gate is applied at the S_N1 node, and a second reference control signal REF_CON(P) outputted to a gate end of a PMOS transistor of the transfer gate is applied at the R_N2 node.

The first and second ferroelectric capacitors FC1 and FC2 are used for storing program data, and the third and fourth ferroelectric capacitors FC3 and FC4 are used for matching capacitance loads of the S_N1 and R_N2 nodes which are sensing nodes.

Figure 26B:
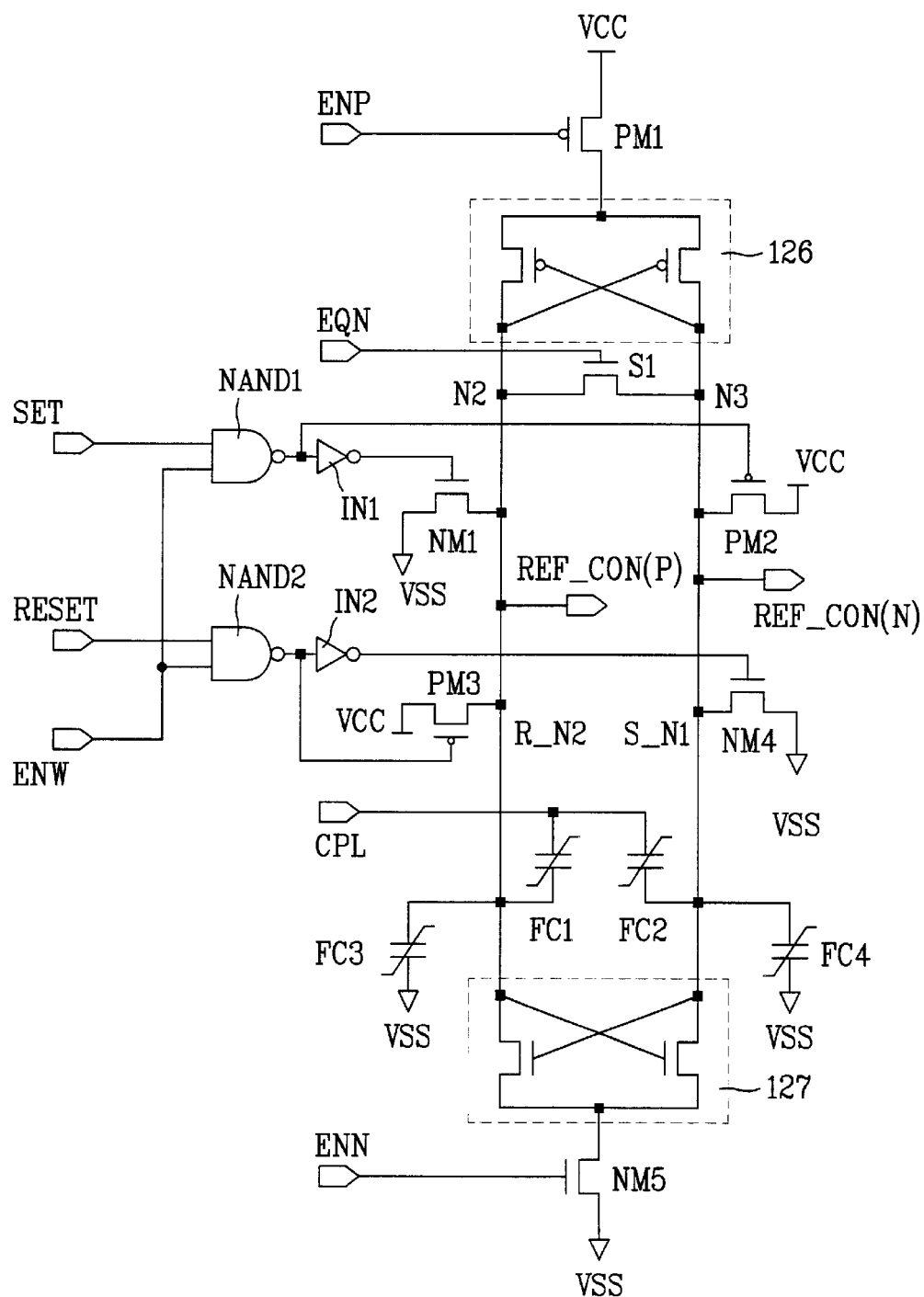
FIG. 26B illustrates a circuit for a reference control unit in FIG. 23 according to a second method.

A construction of a reference control unit for low voltage operation according to a second method is explained by referring to FIG. 26B as follows. A reference control unit according to a second method is similar in structure to that according to the first method, but differs in that the second NMOS transistor NM2 of the first method is replaced by a second PMOS transistor PM2 having a gate connected to an output end of the first logic gate NAND1 and that the third NMOS transistor NM3 of the first method is replaced by a third PMOS transistor PM3 having a gate connected to an output end of the second logic gate NAND2.

Operation for adjusting a reference level by turning on/off the transfer gate using the above-constituted circuit is explained as follows. The SET and RESET signals are inputted in the reference control unit using the address input pad. In this case, if a logic '1' signal is inputted to the address input pad, '1' and '0' are inputted to SET and RESET input terminals, respectively. Moreover, if a logic '0' signal is inputted to the address input pad, '0' and '1' are inputted to SET and RESET input terminals, respectively. Hence, when logic '1' is inputted to he SET input terminal, the S_N1 node becomes "high" level thereby pulling the first reference control signal REF_CON(N) "high", and the R_N2 node becomes "low" level thereby pulling the second reference control signal REF_CON(P) "low".

Therefore, the transfer gate having received the first and second reference control signals REF_CON(N) and REF_CON(P) becomes turned on. Moreover, when the logic '1' is inputted to the RESET input terminal, the S_N1 node becomes "low" level thereby pulling the first reference control signal REF_CON(N) "low" and the R_N2 node becomes "high" level thereby pulling the second reference control signal REF_CON(P) "high". Therefore, the transfer gate having received the first and second reference control signals REF_CON(N) and REF_CON(P) is turned off.

In accordance with the on/off state of the transfer gate, the connection between the ferroelectric capacitors and the reference voltage generation lines REF_G1, . . . is determined, thereby adjusting the reference level.

In order to verify the effect of the hybrid bit line structure proposed by a design team for eliminating the bit line cross-talk effect in the nonvolatile ferroelectric memory device according to the present invention, a test is carried out in a manner that a sensing margin of the present invention is compared to that of the previous open structure through FIB circuit amendment of 256K of 0.35 tech open structure under the condition similar to that of the hybrid bit line structure. Moreover, the test result is explained as follows.

Table 1 corresponds to a total of four samples, i.e. two samples for each of SBT and BLT materials, thereby reproducing the results.

First of all, Table 1 shows a result when the SBT material is used.

Moreover, Table 2 shows a result when the BLT material is used.

TABLE 1

| Bit line structure | Test patten | ΔV (medium value) @90C [mV] | ΔV (minimum value) @90C [mV] |
|---|---|---|---|
| Open structure | Sold | 355 | 235 |
| | Stripe (checker) | 255 | 95 |
| Hybrid | Solid | 355 | 200 |
| | Stripe (checker) | 335 | 190 |

TABLE 2

| Bit line structure | Test pattern | ΔV (medium value) @90C [mV] | ΔV (minimum value) @90C [mV] |
|---|---|---|---|
| Open structure | Sold | 480 | 215 |
| | Stripe (checker) | 350 | 40 |
| Hybrid | Solid | 480 | 130 |
| | Stripe (checker) | 480 | 120 |

The following conclusions can be derived from the data in Table 1 and Table 2. First, having ΔV (medium value) lower than BLT, SBT has ΔV (minimum value) more advantageous than BLT. Hence, SBT has better distribution.

Second, ΔV (medium value) is hardly reduced by the change in the hybrid bit line structure.

Third, the bit line cross-talk effect according to the application of the hybrid bit line structure is lower than 5% when a testing error is taken into account.

Fourth, compared to a worst case, the hybrid case provides an improvement in the sensing margin of about 100 mV more than provided by the open case.

Fifth, cell lifetime relating to imprint by the removal of the cross-talk effect is expected to extend to about 30 years from 30 hours when 4K cell array signal distribution is taken as a reference.

Sixth, the cell distribution of the hybrid bit line structure is 12% greater than that of the open structure according to the test. Yet, such a phenomenon is possibly the noise generated in the process of the FIB test. If the actual circuit allows the use of the open bit line structure, the cell lifetime can be more effectively increased.

Accordingly, the nonvolatile ferroelectric memory device and driving method thereof according to the present invention has the following advantages or effects.

First, the bit lines at the upper and lower sections symmetrical about the sense amplifier are used as the main and reference bit lines, respectively, thereby improving the sensing margin by preventing the coupling noise.

Second, since an adjacent bit line is used as the reference bit line, the short-circuit between the reference bit lines has no influence on the reference generation level. Therefore, the present invention prevents the main cell data from interfering with the reference level.

Third, the NMOS capacitors are formed consecutively in the edge reference array unit of the open bit line structure to realize the dummy reference array having conditions similar to that of the main cell bit lines as well as to reduce a layout area.

It will be apparent to those skilled in the art that various modifications and variations can be made in the nonvolatile ferroelectric memory device and the driving method of the present invention without departing from the spirit and scope of the invention. Thus, it is intended that the present invention covers the modifications and variations of this invention provided they come within the scope of the appended claims and their equivalents.

What is claimed is:

1. A nonvolatile ferroelectric memory device comprising:
a plurality of sense amplifiers;
a top cell array unit disposed at an upper section, and a bottom cell array unit disposed at a lower section, the top and bottom cell array units each including a plurality of unit cells, and the top and bottom cell array units being disposed symmetrically about the sense amplifiers;
at least one top reference array unit in a vicinity of the top cell array unit, and at least one bottom reference array unit in a vicinity of the bottom cell array unit;
a plurality of main bit lines connected to the unit cells of the top or bottom cell array unit; and
a plurality of reference bit lines of the bottom or top cell array unit, wherein reference bit lines of the bottom cell array unit correspond to main bit lines of the top cell array unit disposed symmetrically about the sense amplifiers, and reference bit lines of the top cell array unit correspond to main bit lines of the bottom cell array unit disposed symmetrically about the sense amplifiers.

2. The nonvolatile ferroelectric memory device of claim 1, wherein the top and bottom cell array units are disposed in an open bit line structure, and each reference array unit comprising:
a middle reference array unit disposed in a middle section of the cell array unit; and
an edge reference array unit disposed at an edge section of the cell array unit.

3. The nonvolatile ferroelectric memory device of claim 2, wherein the sense amplifiers are disposed alternately to lie each between the top and bottom cell array units, or between the top cell array unit and the edge reference array unit, or between the bottom cell array unit and the edge reference array unit.

4. The nonvolatile ferroelectric memory device of claim 1, wherein the top and bottom cell array units are disposed in a folded bit line structure.

5. The nonvolatile ferroelectric memory device of claim 1, wherein the top and bottom cell array units are disposed in a folded bit line structure, and the bit lines connected to the sense amplifiers are disposed in an open bit line structure, wherein:

each pair of consecutive bit lines from the top cell array unit shares one of the sense amplifiers, and each pair of consecutive the bit lines from the bottom cell array unit shares the same sense amplifier as the corresponding pair from the top cell array unit, whereby the nonvolatile ferroelectric memory device has a hybrid bit line structure.

6. The nonvolatile ferroelectric memory device of claim 5, wherein the bit lines of the top and bottom cell array units are connected to the sense amplifiers through a plurality of switching transistors, whereby the bit lines are respectively controlled by these transistors.

7. The nonvolatile ferroelectric memory device of claim 6, further comprising a main bit line switching signal applying line, wherein each of a plurality of the switching transistors has a gate terminal connected to the main bit line switching signal applying line, a drain terminal connected to a source of a preceding adjacent switching transistor, and a source terminal connected to a ground voltage terminal.

8. The nonvolatile ferroelectric memory device of claim 2, the plurality of sense amplifiers further comprising:

a plurality of signal buses, each signal bus corresponding to one sense amplifier;

a write control unit driven by a data transferred through a signal bus;

a first switching transistor disposed between the signal bus and a power supply voltage terminal;

a second switching transistor disposed between a reference bus and a ground voltage terminal; and a third switching transistor disposed between the reference bus and the power supply voltage terminal.

9. A nonvolatile ferroelectric memory device comprising:

a top cell array unit including a plurality of unit cells;

a bottom cell array unit including a plurality of unit cells;

a middle reference array unit disposed in a middle area between the top and bottom cell array units;

a plurality of edge reference array units disposed at edge sections of the top and bottom cell array units, respectively; and a plurality of sense amplifiers, wherein the top cell array unit is disposed at an upper section, the bottom cell array unit is disposed at a lower section, the top and bottom cell array units being disposed symmetrically about the sense amplifiers, wherein the sense amplifiers are disposed alternately to lie each between the top and bottom cell array units, or between the top cell array unit and an edge reference array unit, or between the bottom cell array unit and an edge reference array unit, wherein bit lines at the lower section below the sense amplifiers disposed between the top and bottom cell array units and the edge reference array units are main bit lines when the bit lines at the upper section above the sense amplifiers disposed between the top and bottom cell array units and the edge reference array units are reference bit lines, and wherein the bit lines at the lower section below the sense amplifiers formed between the top and bottom cell array units and the edge reference array units are the reference bit lines when the bit lines at the upper section above the sense amplifiers formed between the top and bottom cell array units and the edge reference array units are the main bit lines.

10. The nonvolatile ferroelectric memory device of claim 9, wherein the cell array is folded symmetrically about the bit line to form an open bit line structure having the unit cells overlapped with each other.

11. The nonvolatile ferroelectric memory device of claim 9, the middle reference array unit further comprising;

a plurality of bit lines disposed in a direction in a unit cell block;

a reference word line disposed in a direction perpendicular to the bit lines;

a reference plate line disposed in the same direction as the reference word line;

a plurality of reference capacitors disposed in parallel with each other, each reference capacitor having first and second electrodes connected to the reference plate line and a reference line as a storage node, respectively;

a level initialization unit including an NMOS transistor having a gate and two electrodes wherein a reference cell equalizer control signal is applied to the gate, and the two electrodes are respectively connected to a ground terminal and the reference line as the storage node; and a switching block including a plurality of transistors, wherein the transistors have gates jointly connected to the reference word line, and each transistor has one electrode connected to the respective corresponding bit lines and another electrode connected to the reference line as the storage node.

12. The nonvolatile ferroelectric memory device of claim 9, the edge reference line further comprising:

a plurality of reference bit lines corresponding respectively to bit lines from the middle reference array unit;

an outermost NMOS transistor and a plurality of inner NMOS transistors disposed between the reference bit lines, wherein the gate of each NMOS transistor is connected to ground level, the drain of each NMOS transistor is connected to a following reference bit line, the source of each inner NMOS transistor is connected to a preceding reference bit line; and a dummy load section, wherein a source terminal of the outermost NMOS transistor is connected to ground level.

13. A nonvolatile ferroelectric memory device comprising:

top and bottom cell array units disposed at an upper and a lower sections symmetrical about a plurality of sense amplifiers, each cell array unit including a plurality of unit cells;

a plurality of reference array units disposed at edge sections of the top and bottom cell array units corresponding to the sense amplifiers, respectively;

a plurality of bit lines wherein two of the bit lines of the top cell array unit and two of the corresponding bit lines of the bottom cell array unit share one of the sense amplifiers, wherein the bit lines at the lower area symmetrical about the sense amplifiers are used as reference bit lines when the bit lines at the upper area symmetrical about the sense amplifiers are used as main bit lines, and wherein two bit lines adjacent to the main and reference bit lines at the upper and lower sections are used as dummy reference bit lines; and a plurality of switching devices receiving first and second control signals to control whether to connect the sense amplifiers and bit lines to each other, wherein corresponding bit lines from the upper and lower sections are symmetrical about the sense amplifiers and are controlled by the same control signal.

14. The nonvolatile ferroelectric memory device of claim 13, wherein the top and bottom cell array units are folded symmetrically about the bit line to form a cell array with a folded bit line structure, wherein the unit cells are disposed alternately in a non-overlapping manner with respect to each other.

15. The nonvolatile ferroelectric memory device of claim 14, wherein the cell array with the folded bit line structure further comprises:
 a plurality of pairs of lines consisting of a word line and a plate line disposed in parallel with each other; and
 a plurality of bit lines disposed in a direction perpendicular to the pairs of word and plate lines,
 wherein cells connected to the bit lines and word lines are disposed alternately in a non-overlapping manner with each other when the cell array is folded symmetrically about the bit line.

16. The nonvolatile ferroelectric memory device of claim 14, the cell array of the folded bit line structure, further comprising:
 a plurality of main bit lines disposed along a column direction of the cell array unit;
 a plurality of sub-bit lines disposed in the same direction as the main bit lines, each sub-bit line connected to one terminal of the unit cells;
 first sub-bit line switch signal (SBSW1) applying lines, second left/right sub-bit line switch signals (SBSW2_L, SBSW2_R) applying lines, sub-bit line pull-up signal (SBPU) applying lines, and sub-bit line pull-down signal (SBPD) applying lines, wherein the applying lines control whether to interconnect the sub-bit lines and the main bit lines, wherein the applying lines control whether to pull up two of the sub-bit lines by a self-boost operation, respectively, and wherein the applying lines are disposed perpendicularly to the sub-bit lines to selectively pull down the sub-bit lines, respectively;
 a first switching device receiving a control from the SBSW1 applying line corresponding to the column direction to activate;
 a second switching device receiving controls from the SBSW2_L and SBSW2_R applying lines corresponding to the column direction to transfer selectively a signal of the SBPU applying line to each of the sub-bit lines; and
 a third switching device receiving a control from the SBPD applying line corresponding to the column direction to pull down the sub-bit line selectively.

17. The nonvolatile ferroelectric memory device of claim 13, wherein the sense amplifiers are of a latch type, output nodes of each of the sense amplifiers are shared by every two of the bit lines from the top and bottom cell array units, and each of the sense amplifiers further comprising:
 a first switching transistor disposed between the output nodes and activated by an equalizer signal (EQ);
 second and third switching transistors disposed between the output nodes of the sense amplifier and data buses (DB/DB) and activated by a column selector signal (Yi), respectively; and
 fourth and fifth switching transistors disposed between the output nodes and a ground voltage terminal, and respectively controlled by the equalizer signal.

18. The nonvolatile ferroelectric memory device of claim 13, wherein the reference array unit is disposed between first and second top cell array units or between first and second bottom cell array units, and, in order to adjust an internal reference level, the reference array unit further comprising:
 a plurality of reference capacitors F16-1, F16-2, F16-3, F16-4, . . . , F16-n disposed in parallel with each other, the reference capacitors having first electrodes jointly connected to a reference plate line REF_PL, and second electrodes jointly connected to a reference line as a storage node;
 a plurality of NMOS switching transistors NI-1, NI-2, NI-3, NI-4, . . . connected between the reference ferroelectric capacitors and the bit lines of the first top or bottom cell array unit, respectively in one-to-one correspondence with a plurality of the ferroelectric capacitors, wherein odd numbered NMOS transistors NI-1, NI-3, NI-5, . . . and even numbered NMOS transistors NI-2, NI-4, NI-6, . . . are controlled by first and second bottom reference word lines REF_WL1B and REF_WL2B, respectively;
 a plurality of NMOS switching transistors NII-1, NII-2, NII-3, NII-4, . . . connected between the reference ferroelectric capacitors and the bit lines of the second top or bottom cell array unit, respectively in one-to-one correspondence with a plurality of the ferroelectric capacitors, wherein odd numbered NMOS transistors NII-1, NII-3, NII-5, . . . and even numbered NMOS transistors NII-2, NII-4, NI-I6, . . . are controlled by first and second top reference word lines REF_WL1T and REF_WL2T, respectively; and
 a level initialization unit driven by a reference equalizer signal.

19. The nonvolatile ferroelectric memory device of claim 13, wherein the reference array unit further comprises:
 a plurality of internally disposed switching transistors and an internally disposed level initialization unit in order to transfer a reference level provided externally;
 an odd reference generation unit disposed at a right side and an even reference generation units disposed at a left side, the odd and even reference generation units applying a reference voltage externally to odd and even numbered reference array units respectively;
 an odd switching unit disposed at the right side to control the transfer of the reference voltage to each of the odd numbered reference bit lines;
 an even switching unit at the left side to control the transfer of the reference voltage to each of the even numbered reference bit lines; and
 an odd pull-down unit and an even pull-down unit connected to respective reference bit lines, the odd pull-down unit including reference pull-down transistors disposed at the right side, the even pull-down unit including reference pull-down transistors disposed at the left side, each pull-down transistor pulling down respectively a corresponding reference bit line by receiving a control signal from a reference equalizing signal.

20. The nonvolatile ferroelectric memory device of claim 13, wherein the reference array unit further comprises:
 a plurality of internally disposed switching transistors and an internally disposed level initialization unit in order to transfer a reference level provided externally;

a pair of mutually corresponding odd reference generation units disposed at a left and right sides, and a pair of mutually corresponding even reference generation units disposed at the left and right sides, the odd and even reference generation units applying a reference voltage externally to odd and even numbered reference array units respectively;

pairs of mutually corresponding odd switching unit disposed at the left and right sides to control the transfer of the reference voltage to each of the odd numbered reference bit lines;

pairs of mutually corresponding even switching units disposed at the left and right sides to control the transfer of the reference voltage to each of the even numbered reference bit lines; and a pair of mutually corresponding odd pull-down units and a pair of mutually corresponding even pull-down units connected to respective reference bit lines, the odd pull-down units including reference pull-down transistors disposed at the left and right sides, the even pull-down units including reference pull-down transistors disposed at the left and right sides, each pair of pull-down transistors pulling down respectively a corresponding reference bit line by receiving a control signal from a reference equalizing signal.

21. The nonvolatile ferroelectric memory device of claim 16, in order to transfer a reference level provided externally, the reference cell array unit further comprising:

a plurality of NMOS switching transistors NI-1, NI-2, NI-3, NI-4, . . . ; and a plurality of NMOS switching transistors NII-1, NII-2, NII-3, NII-4, . . . , wherein the reference array unit includes means for adjusting the internal reference level, and excludes a plurality of the reference ferroelectric capacitors and the level initialization unit.

22. The nonvolatile ferroelectric memory device of claim 19, the reference generation unit further comprising:

a plurality of ferroelectric capacitors having first electrodes jointly connected to a reference plate line REF_PL and second electrodes jointly connected to a reference voltage generation line REF_G1 as a storage node;

a plurality of fuses disposed between the second electrodes of the ferroelectric capacitors and the reference voltage generation line REF_G1, respectively to adjust a variation of the reference level in accordance with a process variation; and a level initialization unit having a gate terminal receiving a reference equalizer signal, and drain and source terminals respectively connected to the reference voltage generation line REF_G1 and ground voltage terminal.

23. The nonvolatile ferroelectric memory device of claim 19, the reference generation unit further comprising:

a plurality of ferroelectric capacitors having first electrodes jointly connected to a reference plate line REF_PL and second electrodes jointly connected to a reference voltage generation line REF_G1 as a storage node;

a plurality of transfer gates disposed between the second electrodes of the ferroelectric capacitors and the reference voltage generation line REF_G1, respectively to adjust a variation of the reference level in accordance with a process variation;

a level initialization unit having a gate terminal receiving a reference equalizer signal and drain and source terminals respectively connected to the reference voltage generation line REF_G1 and ground voltage terminal; and a plurality of reference control units controlling the transfer gates, respectively.

24. The nonvolatile ferroelectric memory device of claim 23, each of the reference control units further comprising:

a first logic gate carrying out logical multiply on a first control signal ENW and a SET signal inputted through an external address pad to invert a corresponding logical product;

a second logic gate carrying out logical multiply on the first control signal ENW and a RESET signal inputted through the external address pad to invert a corresponding logical product;

a first inverter IN1 inverting a signal out of the first logic gate;

a second inverter IN2 inverting a signal out of the second logic gate;

a first PMOS transistor PM1 receiving a PMOS enable signal ENP to transfer a power supply voltage VCC to a first node N1;

a first latch having one node connected to the first node N1 and other nodes connected respectively to second and third nodes N2 and N3;

a first NMOS switch S1 receiving an equalizer signal EQN to control whether to connect the second and third nodes N2 and N3 to each other, a first NMOS transistor NM1 having gate, drain, and source terminals connected to an output terminal of the first inverter IN1, the second node N2, and a ground voltage terminal VSS, respectively;

a second NMOS transistor NM2 having gate, drain, and source terminals connected to the output terminal of the first inverter IN1, the third node N3, and a power supply voltage terminal VCC, respectively;

a third NMOS transistor NM3 having gate, drain, and source terminals connected to an output terminal of the, second inverter IN2, a fifth node R_N2, and the power supply voltage terminal VCC, respectively;

a fourth NMOS transistor NM4 having gate, drain, and source terminals connected to the output terminal of the second inverter IN2, a sixth node S_N1, and the ground voltage terminal VSS, respectively;

a fifth NMOS transistor NM5 receiving an NMOS enable signal ENN to transfer a ground voltage VSS to a fourth node N4;

a second latch having one node connected to the fourth node N4 and other nodes connected respectively to the fifth and sixth nodes R_N2 and S_N1;

a first ferroelectric capacitor FC1 connected between a second control signal (CPL) input terminal and the fifth node R_N2;

a second ferroelectric capacitor FC2 connected between the second control signal (CPL) input terminal and sixth node S_N1;

a third ferroelectric capacitor FC3 connected between the fifth node R_N2 and ground voltage terminal VSS; and a fourth ferroelectric capacitor FC4 connected between the sixth node S_N1 and ground voltage terminal VSS.

25. The nonvolatile ferroelectric memory device of claim 23, each of the reference control units further comprising:

a first logic gate carrying out logical multiply on a first control signal ENW and a SET signal inputted through an external address pad to invert a corresponding logical product;

a second logic gate carrying out logical multiply on the first control signal ENW and a RESET signal inputted through the external address pad to invert a corresponding logical product;

a first inverter IN1 inverting a signal out of the first logic gate;

a second inverter IN2 inverting a signal out of the second logic gate;

a first PMOS transistor PM1 receiving a PMOS enable signal ENP to transfer a power supply voltage VCC to a first node N1;

a first latch having one node connected to the first node N1 and other nodes connected respectively to second and third nodes N2 and N3;

a first NMOS switch S1 receiving an equalizer signal EQN to control whether to connect the second and third nodes N2 and N3 to each other, a first NMOS transistor NM1 having gate, drain, and source terminals connected to an output terminal of the first inverter IN1, the second node N2, and a ground voltage terminal VSS, respectively;

a second PMOS transistor PM2 having gate, drain, and source terminals connected to an output terminal of the first logic gate, the third node N3, and a power supply voltage terminal VCC, respectively;

a third PMOS transistor PM3 having gate, drain, and source terminals connected to an output terminal of the second logic gate, a fifth node R_N2, and the power supply voltage terminal VCC, respectively;

a fourth NMOS transistor NM4 having gate, drain, and source terminals connected to an output terminal of the second inverter IN2, a sixth node S_N1, and the ground voltage terminal VSS, respectively;

a fifth NMOS transistor NM5 receiving an NMOS enable signal ENN to transfer a ground voltage VSS to a fourth node N4;

a second latch having one node connected to the fourth node N4 and other nodes connected respectively to the fifth and sixth nodes R_N2 and S_N1;

a first ferroelectric capacitor FC1 connected between a second control signal(CPL) input terminal and the fifth node R_N2;

a second ferroelectric capacitor FC2 connected between the second control signal(CPL) input terminal and sixth node S_N1;

a third ferroelectric capacitor FC3 connected between the fifth node R_N2 and ground voltage terminal VSS; and a fourth ferroelectric capacitor FC4 connected between the sixth node S_N1 and ground voltage terminal VSS.

26. In a nonvolatile ferroelectric memory device including top and bottom cell array units disposed at upper and lower sections symmetrical about sense amplifiers to include a plurality of unit cells, respectively, at least one reference array unit disposed in a vicinity of each of the top and bottom cell array units to correspond to each other, and bit lines disposed on the upper and lower sections to share the sense amplifiers, respectively, a method of driving the nonvolatile ferroelectric memory device having the feature that a reference voltage generated from the reference array unit is applied to the bit lines disposed at the lower sections below the sense amplifiers so that the bit lines at the lower sections operate as reference bit lines when the bit lines disposed at the upper sections above the sense amplifiers operate as main bit lines.

27. The method of claim 26, wherein the nonvolatile ferroelectric memory device further includes middle reference array units disposed in middle sections of the top and bottom cell array units, respectively to transfer the reference voltage to the reference bit lines.

28. The method of claim 26, wherein first and second bit lines at the upper sections and first and second bit lines at the lower sections share one of the sense amplifiers when the top and bottom cell array units form a folded bit line structure, and wherein, if the first bit line at the upper area operates as the main bit line, the corresponding first bit line at the lower area receives the reference voltage from the reference array unit to operate as the reference bit line and the second bit lines at the upper and lower sections operate as dummy reference bit lines.

29. The method of claim 26, wherein, if the nonvolatile ferroelectric memory device further includes a reference control unit performing a programming operation of adjusting a level of the reference voltage, n commands are sequentially inputted to reach an (n+1)th state from a first state before the programming operation is executed, and wherein the level-adjusted reference voltage is applied to the reference bit line by outputting a program signal after the (n+1)th state is reached.

* * * * *